United States Patent
Shim et al.

(10) Patent No.: US 9,679,659 B2
(45) Date of Patent: Jun. 13, 2017

(54) METHODS OF OPERATING A NONVOLATILE MEMORY DEVICE

(71) Applicants: Sunil Shim, Seoul (KR); Joon-sung Lim, Yongin-si (KR); Jin-Kyu Kang, Seoul (KR); Euido Kim, Ansan-si (KR); Jang-Gn Yun, Hwaseong-si (KR)

(72) Inventors: Sunil Shim, Seoul (KR); Joon-sung Lim, Yongin-si (KR); Jin-Kyu Kang, Seoul (KR); Euido Kim, Ansan-si (KR); Jang-Gn Yun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/859,637

(22) Filed: Sep. 21, 2015

(65) Prior Publication Data
US 2016/0111165 A1   Apr. 21, 2016

(30) Foreign Application Priority Data

Oct. 20, 2014   (KR) .................. 10-2014-0141719

(51) Int. Cl.
| | | |
|---|---|---|
| *G11C 16/04* | (2006.01) | |
| *G11C 16/16* | (2006.01) | |
| *G11C 16/34* | (2006.01) | |
| *G11C 11/56* | (2006.01) | |

(52) U.S. Cl.
CPC .......... *G11C 16/16* (2013.01); *G11C 11/5635* (2013.01); *G11C 16/3445* (2013.01)

(58) Field of Classification Search
CPC . G11C 16/14; G11C 16/3445; G11C 16/3459; G11C 16/16; G11C 16/349; G11C 11/5635; G11C 13/0097
See application file for complete search history.

(56) References Cited

U.S. PATENT DOCUMENTS

| | | |
|---|---|---|
| 6,594,178 B2 | 7/2003 | Choi et al. |
| 6,967,873 B2 | 11/2005 | Hamilton et al. |
| 7,679,133 B2 | 3/2010 | Son et al. |
| 7,907,449 B2 | 3/2011 | Lee et al. |
| 8,345,485 B2 | 1/2013 | Choy et al. |
| 8,379,445 B2 | 2/2013 | Shibata et al. |
| 8,395,945 B2 | 3/2013 | Mokhlesi |
| 8,553,466 B2 | 10/2013 | Han et al. |

(Continued)

FOREIGN PATENT DOCUMENTS

| | | |
|---|---|---|
| JP | 2012-027979 | 2/2012 |
| KR | 1020120069115 A | 6/2012 |

(Continued)

*Primary Examiner* — Son Dinh
*Assistant Examiner* — Uyen B Tran
(74) *Attorney, Agent, or Firm* — Myers Bigel, P.A.

(57) ABSTRACT

An operating method of a nonvolatile memory device is provided which sequentially performs a plurality of erase loops to erase at least one of a plurality of memory blocks. The operating method comprises performing at least one of the plurality of erase loops; performing a post-program operation on the at least one memory block after the at least one erase loop is executed; and performing remaining erase loops of the plurality of erase loops. The post-program operation is not performed when each of the remaining erase loops is executed.

7 Claims, 29 Drawing Sheets

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 8,976,597 B2 | 3/2015 | Shiino et al. | |
| 2001/0043492 A1* | 11/2001 | Lee | G11C 16/16 365/185.29 |
| 2011/0233648 A1 | 9/2011 | Seol et al. | |
| 2012/0275234 A1* | 11/2012 | Lee | G11C 16/0483 365/185.23 |
| 2014/0112074 A1* | 4/2014 | Rhie | G11C 16/14 365/185.11 |
| 2015/0200019 A1* | 7/2015 | Chin | G11C 16/3454 365/185.17 |

FOREIGN PATENT DOCUMENTS

| | | |
|---|---|---|
| KR | 1020130072517 A | 7/2013 |
| KR | 1020130091075 A | 8/2013 |

\* cited by examiner

FIG. 14

LUT

| Off-cell Count Value | Increment of Vers |
|---|---|
| OC1 | ΔVers1 |
| OC2 | ΔVers2 |
| OC3 | ΔVers3 |
| OC4 | ΔVers4 |
| ⋮ | ⋮ |
| OCm | ΔVersm |

METHODS OF OPERATING A
NONVOLATILE MEMORY DEVICE

CROSS-REFERENCE TO RELATED APPLICATION

This application claims priority under 35 U.S.C. §119 to Korean Patent Application No. 10-2014-0141719, filed Oct. 20, 2014 in the Korean Intellectual Property Office, the entire content of which is incorporated herein by reference.

BACKGROUND

Embodiments of the inventive concepts relate to semiconductor memory devices, and more particularly, relate to methods of operating a nonvolatile memory device.

A semiconductor memory device is a storage device which is fabricated using semiconductors such as, for example, silicon (Si), germanium (Ge), gallium arsenide (GaAs), and indium phosphide (InP). Semiconductor memory devices are classified into volatile memory devices and nonvolatile memory devices.

Volatile memory devices refer to memory device that may lose the data that is stored therein when power to the device is turned off. Volatile memory devices include the following: a static RAM (SRAM), a dynamic RAM (DRAM), and a synchronous DRAM (SDRAM). Nonvolatile memory devices refer to memory devices that retain stored data even after the device is powered off. Nonvolatile memory devices include the following: a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

Flash memory devices are used in a wide variety of different applications due to the following advantages that may be provided by these devices: mass storage, low noise, and low power. During operation flash memory devices apply an erase voltage to a substrate thereof to lower the threshold voltages of the memory cells of the flash memory device. That is, memory blocks of the flash memory device are erased. However, in the flash memory device, physical positions or physical characteristics of memory blocks and memory cells may be different from each other, thereby resulting in a wide distribution of threshold voltages in the erased memory cells. This erase state is referred to as "Deep Erase." Memory cells having the deep erase state have very low threshold voltages, thereby lowering speed of a following program operation or data retention capacity after programming.

SUMMARY

One aspect of embodiments of the inventive concepts is directed to provide a method of operating a nonvolatile memory device which sequentially performs a plurality of erase loops to erase a memory block. The method comprises performing at least one of the erase loops; performing a post-program operation on the memory block after the at least one erase loop is performed; and performing the remaining erase loops. The post-program operation is not performed when each of the remaining erase loops is performed.

In exemplary embodiments, performing the post-program operation on the memory block includes applying a post-program voltage to a plurality of word lines that are connected to the memory block.

In exemplary embodiments, performing the post-program operation on the memory block includes sequentially performing a plurality of program loops.

In exemplary embodiments, performing the remaining erase loops includes detecting a threshold voltage distribution of the memory block; adjusting an erase voltage increment, based on the detected threshold voltage distribution; and performing at least one of the remaining erase loops using the adjusted erase voltage increment.

In exemplary embodiments, detecting the threshold voltage distribution includes detecting off cells that have a threshold voltage that is higher than an off cell voltage from among memory cells that are connected to an erase reference word line. The erase reference word line is one of a plurality of word lines that are connected to the memory block.

In exemplary embodiments, adjusting the erase voltage increment includes adjusting the erase voltage increment based on the number of off cells that are detected.

In exemplary embodiments, adjusting the erase voltage increment includes adjusting a pulse width of an erase voltage based on the number of off cells that are detected.

In exemplary embodiments, performing the remaining erase loops includes using the adjusted erase voltage increment to set voltages that are applied to a plurality of word lines that are connected to the memory block during at least one of the remaining erase loops.

In exemplary embodiments, the method may further include classifying the plurality of word lines into a plurality of zones and independently controlling voltages of word lines included in each of the zones.

In exemplary embodiments, the memory block includes a plurality of strings of charge trap flash memory cells stacked in a direction perpendicular to a substrate.

In exemplary embodiments, the nonvolatile memory device comprises a three-dimensional memory cell array.

In exemplary embodiments, the three-dimensional memory cell array comprises a nonvolatile memory that is monolithically formed in one or more physical levels of memory cells having active areas disposed above a semiconductor substrate.

Another aspect of embodiments of the inventive concepts is directed to a method of erasing a memory block of a nonvolatile memory device, the memory block being formed on a substrate. The method comprises applying a first erase voltage to the substrate; applying an erase verification voltage to a plurality of word lines that are connected to the memory block to check an erase state of the memory block; applying a post program voltage to the plurality of word lines to post-program the memory block; and then applying a second erase voltage to the substrate, a level of the second erase voltage being higher by an erase voltage increment than a level of the first erase voltage; applying the erase verification voltage to the plurality of word lines to check the erase state of the memory block; and then applying a third erase voltage to the substrate, a level of the third erase voltage being higher by the erase voltage increment than the level of the second erase voltage; and applying the erase verification voltage to the plurality of word lines to check the erase state of the memory block.

In exemplary embodiments, the erase method further comprises terminating the erase operation when an erase state of the memory block is passed.

In exemplary embodiments, the erase method further comprises detecting a threshold voltage distribution of the memory block before applying the second erase voltage to the substrate.

In exemplary embodiments, detecting the threshold voltage distribution includes detecting off cells that have a threshold voltage that is higher than an off cell voltage from among memory cells that are connected to one or more erase reference word lines. The erase reference word lines are one or more of the plurality of word lines that are connected to the memory block.

In exemplary embodiments, the erase method further comprises adjusting the erase voltage increment based on the detected threshold voltage distribution.

In exemplary embodiments, adjusting the erase voltage increment includes increasing the erase voltage increment with an increase in the number of off cells detected and decreasing the erase voltage increment with a decrease in the number of off cells detected.

In exemplary embodiments, adjusting the erase voltage increment includes adjusting pulse widths of the second and third erase voltages, based on the number of off cells detected.

In exemplary embodiments, adjusting the pulse widths of the second and third erase voltages includes increasing the pulse widths of the second and third erase voltages with an increase in the number of off cells detected and decreasing the pulse widths of the second and third erase voltages with a decrease in the number of off cells detected.

Still another aspect of embodiments of the inventive concepts is directed to a method of erasing a memory block of a nonvolatile memory device by performing a plurality of erase loops. The method comprises performing at least one of the erase loops based on a post-program scheme; detecting a threshold voltage distribution of the memory block using an off cell voltage; and using the detected threshold voltage distribution in performing at least one of the remaining erase loops. Each of the erase loops includes an erase step for applying an erase voltage and an erase verification step for verifying an erase state of the at least one memory block.

In exemplary embodiments, performing at least one of the plurality of erase loops includes post-programming the memory block when the memory block is erase-passed during execution of the at least one erase loop.

In exemplary embodiments, using the detected threshold voltage distribution in performing at least one of the remaining erase loops comprises adjusting an erase voltage increment, based on the detected threshold voltage distribution; and performing the next one of the remaining erase loops using the adjusted erase voltage increment.

In exemplary embodiments, using the detected threshold voltage distribution in performing at least one of the remaining erase loops comprises adjusting a pulse width of an erase voltage, based on the detected threshold voltage distribution; and performing the next one of the remaining erase loops using the adjusted pulse width of the erase voltage.

In exemplary embodiments, using the detected threshold voltage distribution in performing at least one of the remaining erase loops comprises using the adjusted erase voltage increment to set voltages that are applied to a plurality of word lines that are connected to the memory block during at least one of the remaining erase loops.

According to further aspects of the inventive concepts, a method of erasing a memory block of a nonvolatile memory device is provided in which a first erase loop is performed using a first erase scheme; and then a threshold voltage distribution of the memory block is detected; and then an erase voltage increment is adjusted based on the detected threshold voltage distribution to provide an adjusted erase voltage increment; and then a second erase loop is performed using a second erase scheme that is different from the first erase scheme, where the adjusted erase voltage increment is used in performing the second erase loop.

In exemplary embodiments, the adjusted erase voltage increment may be used to set voltages that are applied to a plurality of word lines that are connected to the memory block during the second erase loop.

In exemplary embodiments, the memory block may include a plurality of memory cells and a plurality of word lines may be connected to the memory block, and detecting the threshold voltage distribution of the memory block may comprise selecting a subset of the plurality of memory cells; and detecting a number of the memory cells in the subset of the plurality of memory cells that have a threshold voltage that is higher than an off cell voltage.

In exemplary embodiments, adjusting the erase voltage increment based on the detected threshold voltage distribution to provide an adjusted erase voltage increment may comprise adjusting the erase voltage increment based on the detected number of memory cells that have a threshold voltage that is higher than an off cell voltage.

In exemplary embodiments, the first erase scheme may include a post-program operation in which a plurality of program loops are performed, where each program loop includes a program step in which a program voltage is applied to a word line to program memory cells that are connected to the word line and a verification step where a program verification voltage is applied to verify program states of the memory cells, and the second erase scheme may not include the post-program operation.

In exemplary embodiments, detecting the threshold voltage distribution of the memory block may comprise dividing the memory block into a plurality of zones; and for each of the zones detecting a number of the memory cells from a subset of the memory cells in the zone that have a threshold voltage that is higher than an off cell voltage.

BRIEF DESCRIPTION OF THE FIGURES

Embodiments of the inventive concepts are described below with reference to the accompanying drawings.

FIGS. 12 through 14 are diagrams illustrating the operating method of the nonvolatile memory device shown in FIG. 11.

DETAILED DESCRIPTION

Figure 1:
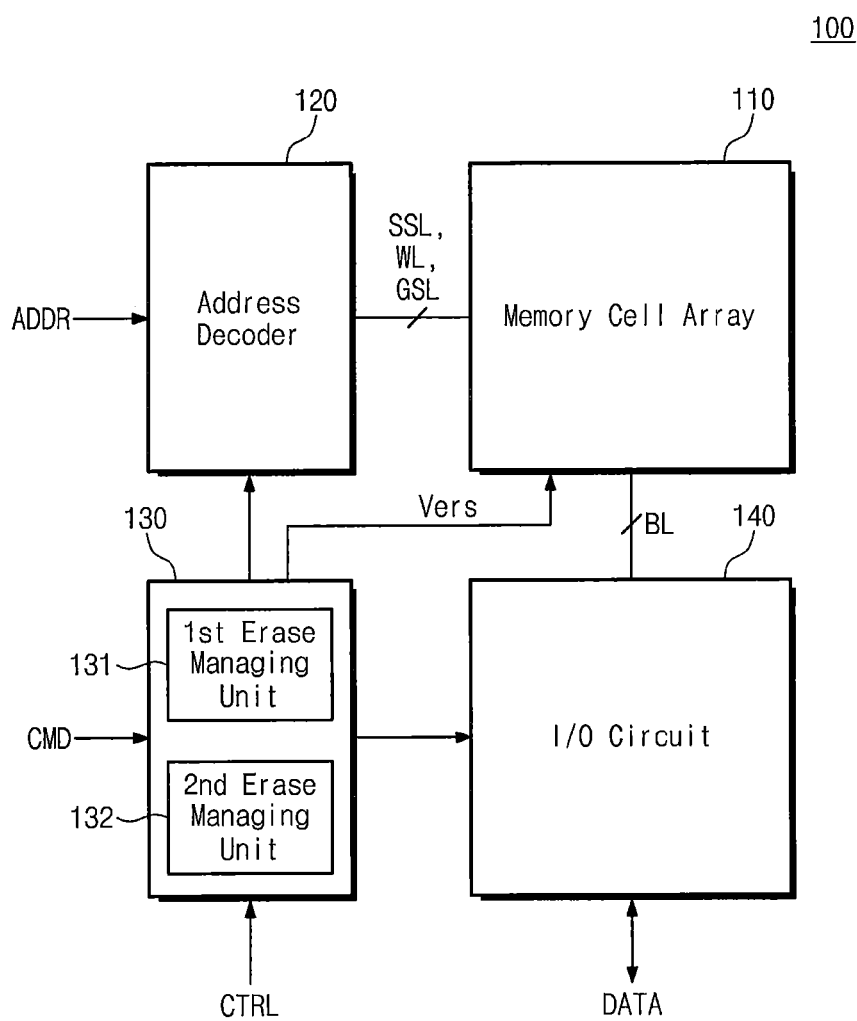
FIG. 1 is a block diagram of a nonvolatile memory device according to an embodiment of the inventive concepts.

Example embodiments of the inventive concepts are disclosed herein. However, specific structural and functional details disclosed herein may be merely representative for purposes of describing the example embodiments. It thus will be appreciated that example embodiments of the inventive concepts may be embodied in many alternate forms and should not be construed as limited to only the example embodiments set forth herein. Accordingly, it should be understood that there is no intent to limit example embodiments of the inventive concepts to the particular forms disclosed herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items. Like numbers refer to like elements throughout.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

It should also be noted that in some alternative implementations, the functions/acts noted may occur out of the order noted in the figures. For example, operations that are shown in succession in two blocks of a flow chart may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A nonvolatile memory device according to an embodiment of the inventive concepts may erase a memory block by performing a plurality of erase loops. The nonvolatile memory device may perform some of the erase loops based on a first erase scheme. The nonvolatile memory device may perform the rest of the erase loops based on a second erase scheme. That is, the nonvolatile memory device may perform an erase operation using two or more erase schemes. This technique may improve a threshold voltage distribution of the erased memory cells in that the threshold voltage distribution may be narrower than it would otherwise be if a single erase scheme was used in the erase operation. As a result, the nonvolatile memory device may have improved reliability.

FIG. 1 is a block diagram schematically illustrating a nonvolatile memory device according to an embodiment of the inventive concepts. Referring to FIG. 1, a nonvolatile memory device 100 includes a memory cell array 110, an address decoder 120, a control logic and voltage generator block 130, and an input/output circuit 140.

The memory cell array 110 contains a plurality of memory blocks, each of which has a plurality of memory strings. Each memory string includes a plurality of memory cells. The memory cells may be connected to word lines. Each memory cell may be a single level cell (SLC) that stores one bit of data or a multi-level cell (MLC) that stores at least two bits of data. In exemplary embodiments, each memory block may be formed in a direction perpendicular to a substrate, that is, the memory cell array 110 may be a three dimensional (3D) memory cell array that has a three-dimensional vertical stack structure. In exemplary embodiments, each of the memory cells may be a charge trap flash memory cell.

The 3D memory cell array is monolithically formed in one or more physical levels of arrays of memory cells having an active area disposed above a semiconductor substrate and circuitry associated with the operation of those memory cells, whether such associated circuitry is above or within such substrate. The term "monolithic" means that layers of each level of the array are directly deposited on the layers of each underlying level of the array.

In an embodiment of the inventive concepts, the 3D memory cell array includes vertical NAND strings that are vertically oriented such that at least one memory cell is located over another memory cell in a direction that is perpendicular to a top surface of the substrate. The at least one memory cell may comprise a charge trap layer. Each vertical NAND string may include at least one select transistor that is located over the memory cells of the NAND string, the at least one select transistor having the same structure as the memory cells in the NAND string and being formed monolithically together with the memory cells of the NAND string.

The following patent documents, which are hereby incorporated by reference, describe suitable configurations for three-dimensional memory cell arrays, in which the three-dimensional memory cell array is configured as a plurality of levels, with word lines and/or bit lines shared between levels: U.S. Pat. Nos. 7,679,133; 8,553,466; 8,654,587; 8,559,235; and U.S. Patent Publication No. 2011/0233648.

In exemplary embodiments, the memory cell array 110 may be formed on a semiconductor substrate (not shown). An erase voltage Vers is applied to the substrate to erase at least one of the memory blocks of the memory cell array 110. In the description that follows, the discussion will focus on erasing one memory block of the memory cell array 110. It will be appreciated that the methods described herein may be used to erase multiple memory blocks or other memory units.

The address decoder 120 is connected to the memory cell array 110 through string selection lines SSL, the word lines WL, and ground selection lines GSL. The address decoder 120 decodes an address ADDR received from an external device (e.g., a memory controller, a host, or an application processor) to drive the string selection lines SSL, the word lines WL, and the ground selection lines GSL, respectively. For example, the address decoder 120 decodes the address ADDR to select at least one of the word lines WL. The address decoder 120 may control an operation for transferring a voltage to the selected word line.

The control logic and voltage generator block 130 controls the address decoder 120 and the input/output circuit 140 in response to a command CMD and a control signal CTRL from the external device. For example, the control logic and voltage generator block 130 controls the address decoder 120 and the input/output circuit 140 such that data received from the external device is written to the memory cell array 110. The control logic and voltage generator block 130 may also control the address decoder 120 and the input/output circuit 140 such that data stored in the memory cell array 110 is output to the external device. Alternatively, the control logic and voltage generator block 130 may control the address decoder 120 and the input/output circuit 140 such that at least one of the memory blocks in the memory cell array 110 is erased.

The control logic and voltage generator block 130 generates various voltages that are used to operate the nonvolatile memory device 100. For example, the control logic and voltage generator block 130 may generate various voltages including the following: selection read voltages, non-selection read voltages, program voltages, pass voltages, erase voltages, verification voltages, erase verification voltages, and so on. Under the control of the control logic and voltage generator block 130, the erase voltages may be supplied to the memory cell array 110 (or substrate) to erase at least one of the memory blocks.

The input/output circuit 140 is connected to the memory cell array 110 through bit lines BL. The input/output circuit 140 exchanges data with the external device. The input/output circuit 140 operates in response to a control of the control logic and voltage generator block 130.

In exemplary embodiments, the input/output circuit 140 may receive data from the external device and may write the input data to the memory cell array 110. The input/output circuit 140 reads data from the memory cell array 110 and outputs the read data to the external device. Although not shown in FIG. 1, the input/output circuit 140 may contain the following: a page buffer (or a page register), a column selector, and a data buffer. In other exemplary embodiments, the input/output circuit 140 may contain the following: a sense amplifier, a write driver, a column selector, and a data buffer.

The nonvolatile memory device 100 according to an embodiment of the inventive concepts erases the memory blocks using an incremental step pulse erase (ISPE) technique. Pursuant to the ISPE technique, a memory block is erased through execution of a series of erase loops. Each erase loop may include an erase step where an erase voltage is applied to the substrate and an erase verification step where an erase verification voltage is applied to word lines connected to the memory block to be erased and an erase state of the erased memory block is checked.

The nonvolatile memory device 100 erases a memory block by sequentially executing erase loops. In exemplary embodiments, the nonvolatile memory device 100 performs at least one erase loop using a first erase scheme and the remaining erase loops using a second erase scheme that is different from the first erase scheme.

In exemplary embodiments, the first erase scheme may include the following methods for improving a threshold voltage distribution (hereinafter referred to as "erase distribution") of the erased memory cells: pre-programming techniques and post-programming techniques. The second erase scheme may include the following erase methods for improving an erase distribution of the erased memory cells: a conventional erase method where erase loops that each include an erase step and an erase verification step are executed, a method for controlling a word line voltage, and a method for controlling an increment in an erase voltage. In exemplary embodiments, the number of erase loops that are based on the first erase scheme may be less than the number of erase loops that are based on the second erase scheme. In exemplary embodiments, a time taken to perform a erase loop that is based on the first erase scheme may be longer than a time taken to perform an erase loop that is based on the second erase scheme.

The control logic and voltage generator block 130 contains a first erase managing unit 131 and a second erase managing unit 132. The first erase managing unit 131 may execute or manage erase loops that are based on the first erase scheme. The second erase managing unit 132 may execute or manage erase loops that are based on the second erase scheme. In exemplary embodiments, the first and second erase managing units 131 and 132 may be implemented in the form of hardware, software, or a combination thereof.

According to exemplary embodiments of the inventive concepts, during one erase operation, the nonvolatile memory device 100 executes erase loops that are based on two or more erase schemes, thereby improving the erase distribution of the erased memory cells. Thus, it is possible to provide a nonvolatile memory device with improved reliability and an operating method thereof.

Figure 2:
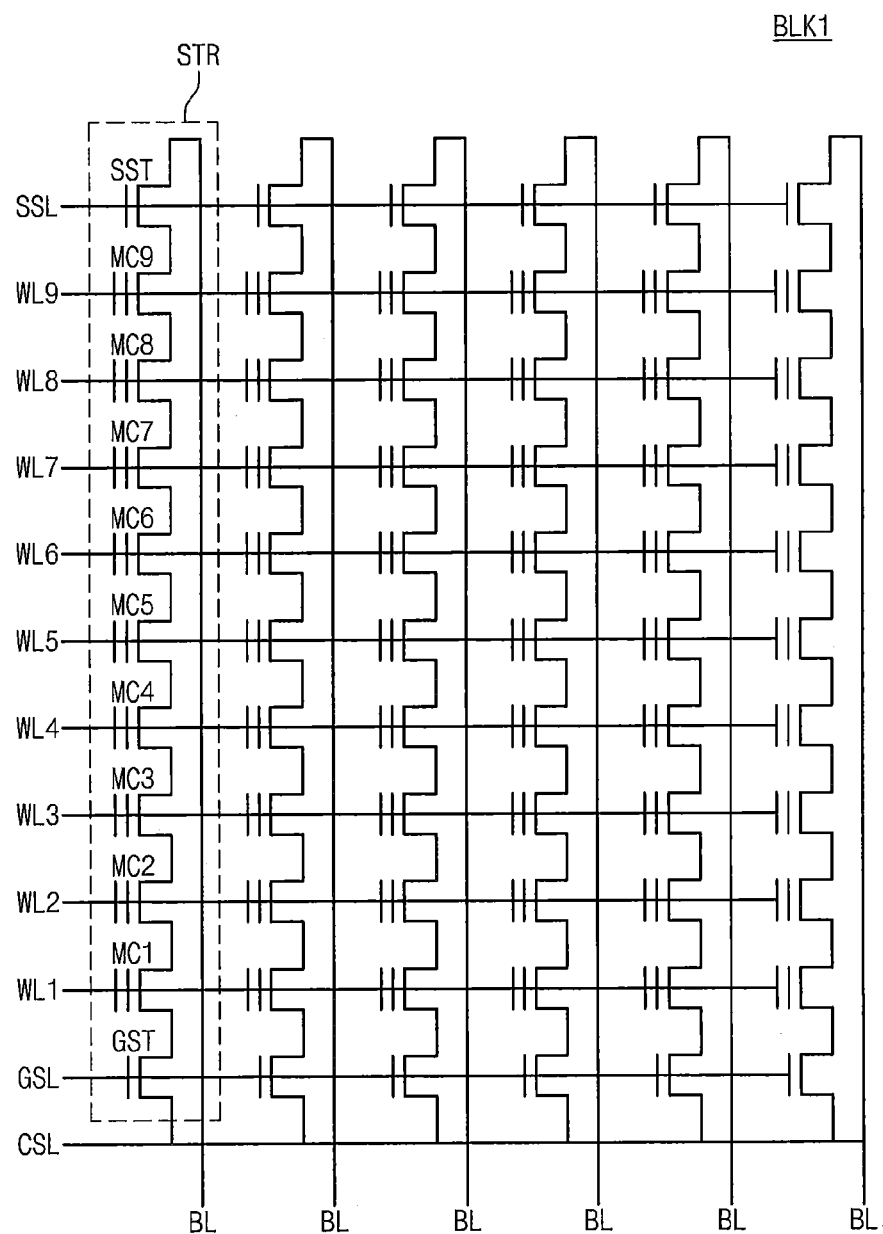
FIG. 2 is a diagram showing a memory block that is included in a memory cell array shown in FIG. 1.

FIG. 2 is a diagram showing a first of a plurality of memory blocks that are included in the memory cell array 110 of FIG. 1. For the sake of simple description, a first memory block BLK1 is described with reference to FIG. 2. However, the scope and spirit of the inventive concepts may not be limited thereto. Memory blocks of a memory cell array 110 may have a structure similar to the first memory block BLK1 shown in FIG. 2.

Referring to FIG. 2, the first memory block BLK1 contains a plurality of strings STR, each of which is connected to a bit line BL. Each string STR has a string selection transistor SST, a plurality of memory cells MC1 through MC9, and a ground selection transistor GST. In each string STR, the string selection transistor SST is connected to a string selection line SSL, the memory cells MC1 through MC9 to word lines WL1 through WL9, and the ground selection transistor GST to a ground selection line GSL. In each string STR, one end of the string selection transistor SST is connected to a bit line BL, one end of the ground selection transistor GST is connected to a common source line CSL, and the memory cells MC1 through MC9 are disposed between the string selection transistor SST and the ground selection transistor GST. In exemplary embodiments, each memory cell may be a single level cell (SLC) storing 1-bit of data or a multi level cell (MLC) storing two or more bits of data. In exemplary embodiments, the first memory block BLK1 may be formed on a substrate (not shown).

The first memory block BLK1 is exemplary. The size of the first memory block BLK1 may increase or decrease in at least one of a row direction or a column direction. As the number of memory cells included in a cell string STR increases or decreases, the number of word lines may increase or decrease. As the number of cell strings included in the first memory block BLK1 increases or decreases, the number of bit lines increases or decreases. As the number of string selection transistors included in the first memory block BLK1 increases or decreases, the number of string selection lines increases or decreases. As the number of ground selection transistors included in the first memory block BLK1 increases or decreases, the number of ground selection lines increases or decreases.

Figure 3:
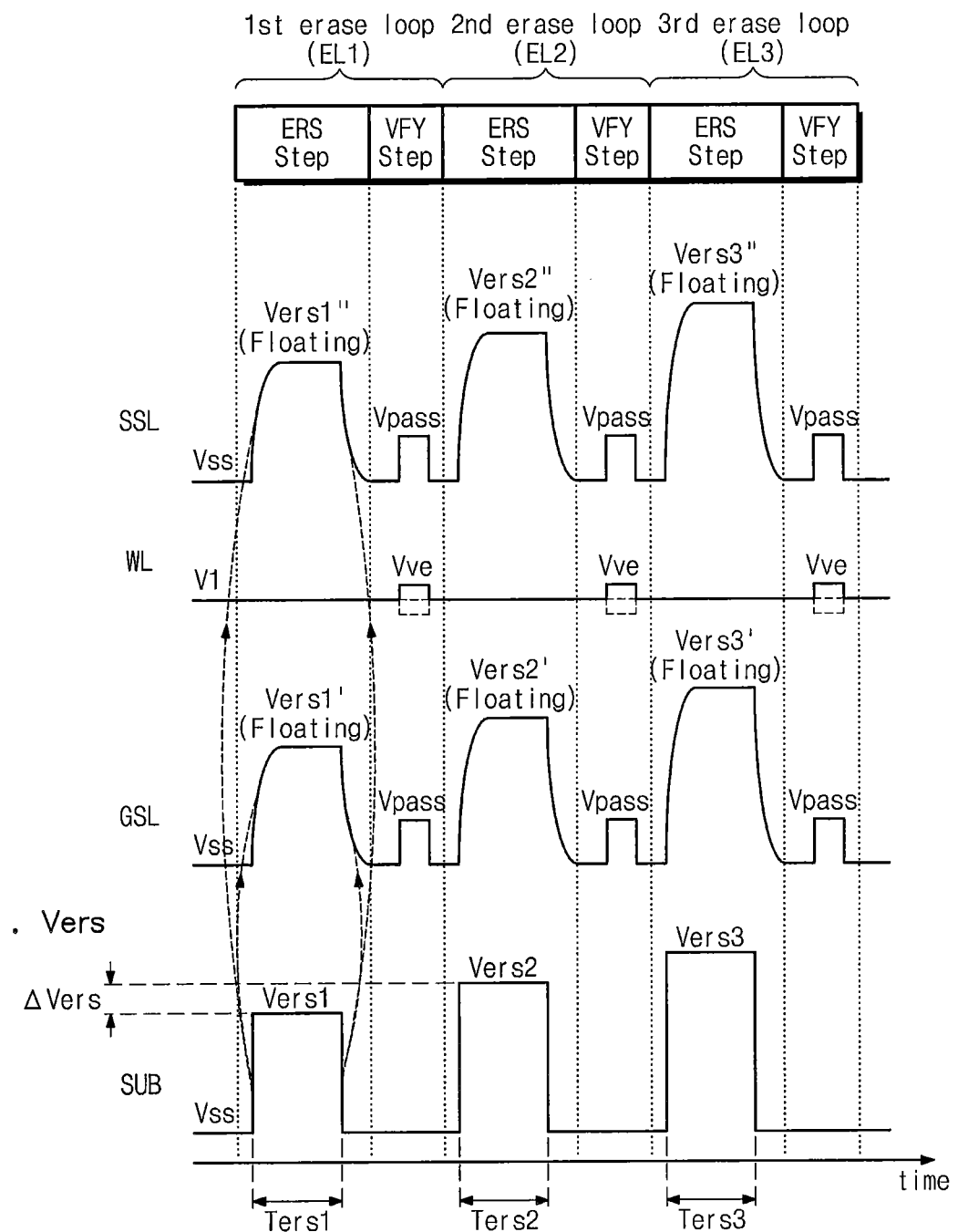
FIGS. 3 and 4 are a timing diagram and a distribution diagram, respectively, that illustrate an erase operation for a nonvolatile memory device.
Figure 4:
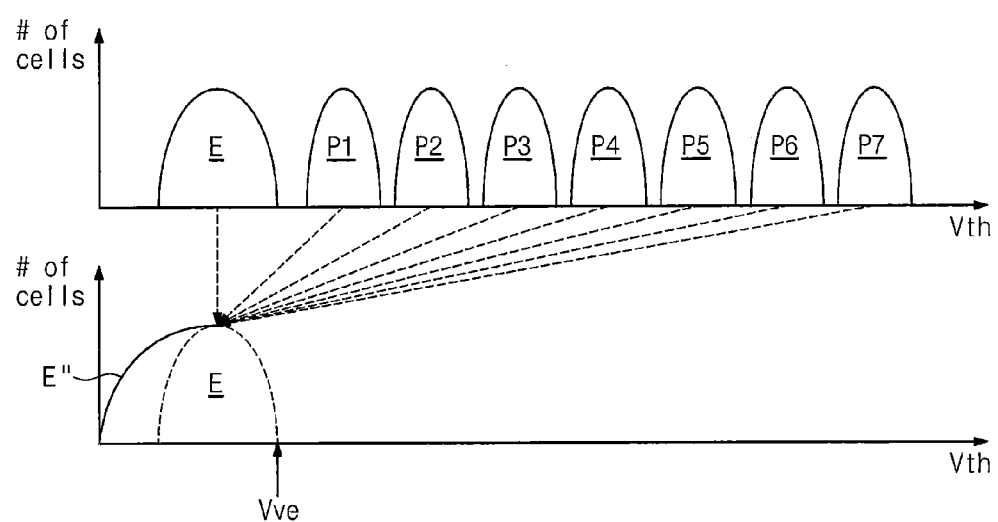

FIGS. 3 and 4 illustrate an erase operation of a nonvolatile memory device. In particular, FIG. 3 is a timing diagram showing voltages applied to a substrate SUB, a ground selection line GSL, word lines WL, and a string selection line SSL during the erase operation. FIG. 4 shows the threshold voltage distributions of the memory cells. In FIG. 3, the horizontal axis represents time, and the vertical axis represents voltage. In FIG. 4, the horizontal axis represents a threshold voltage Vth, and the vertical axis represents the number of memory cells MC.

Embodiments of the inventive concepts will be described under the following assumption: a nonvolatile memory device 100 performs an erase operation by the memory block, the first memory block BLK1 is the memory block selected for erasing, and erasing of the first memory block BLK1 is completed (i.e., BLK1 is erase-passed) after a third erase loop EL3 is executed. However, the scope and spirit of the inventive concepts are not limited thereto. For example, the nonvolatile memory device 100 may perform an erase operation by various erase units, such as a sub block, a super block, a word line, or a page. The erasing of the first memory block BLK1 may be completed before the third erase loop is executed and the erasing operation may then be terminated. Alternatively, the erasing of the first memory block BLK1 may not be completed even after all of the erase loops are performed.

It is assumed that memory cells of the first memory block BLK1 are triple level cells (hereinafter referred to as "TLC"). However, the scope and spirit of the inventive concepts is not limited thereto.

Referring to FIGS. 3 and 4, each memory cell of the first memory block BLK1 may have one of an erase state E and first through seventh program states P1 through P7. Threshold voltages of memory cells of the first memory block BLK1 are distributed as illustrated in FIG. 4.

The nonvolatile memory device 100 performs erase loops EL such that memory cells of the first memory block BLK1 have the erase state E. That is, the nonvolatile memory device 100 erases the first memory block BLK1 using the ISPE technique.

For example, the nonvolatile memory device 100 executes first through third erase loops EL1 through EL3 to erase the first memory block BLK1. Each of the first through third erase loops EL1 through EL3 includes an erase step and an erase verification step. In the erase steps of the first through third erase loops EL1 through EL3, erase voltages Vers1, Vers2, and Vers3 are applied to a substrate SUB, respectively. In the erase verification steps of the first through third erase loops EL1 through EL3, an erase state of the first memory block BLK1 is checked using an erase verification voltage Vve.

In detail, in the erase step of the first erase loop EL1, the nonvolatile memory device 100 applies the first erase voltage Vers1 to the substrate SUB, floats the ground and string selection lines GSL and SSL, and applies a first voltage V1 to word lines WL. In exemplary embodiments, the first voltage V1 applied to word lines WL is modified according to memory cell locations or memory cell speed. Voltages of the ground and string selection lines GSL and SSL increase up to Vers1' and Vers1" due to coupling with the first erase voltage Vers1 supplied to the substrate SUB. Afterwards, the first erase voltage Vers1 supplied to the substrate SUB is discharged to a ground voltage Vss. At this time, voltages of the ground and string selection lines GSL and SSL decrease to the ground voltage Vss due to coupling with the first erase voltage Vers1 discharged from the substrate SUB. In the erase step of the first erase loop EL1, the first erase voltage Vers1 decreases threshold voltages of memory cells of the first memory block BLK1.

Afterwards, in the erase verification step of the first erase loop EL1, an erase verification voltage Vve is applied to the word lines WL, and a pass voltage Vpass is applied to the ground and string selection lines GSL and SSL. In exemplary embodiments, the erase verification voltage Vve may be a positive voltage, a ground voltage, or a negative voltage. The erase verification voltage Vve may be a voltage corresponding to the upper limit of a threshold voltage distribution of an erase state E. The pass voltage Vpass may be a high voltage that is sufficient to turn on a ground selection transistor GST and a string selection transistor SST.

In the erase verification step, memory cells are turned on which have threshold voltages that are higher than the erase verification voltage Vve. For example, in the erase verification step, if it is detected that at least one memory cell has been turned on by the erase verification voltage Vve, this may indicate that the erasing of the first memory block BLK1 is not completed (i.e., erase verification failure). In the erase verification step, if all of the memory cells are turned off by the erase verification voltage Vve, this may indicate that the erasing of the first memory block BLK1 is completed (i.e., erase pass).

If at the conclusion of the first erase loop it is determined that the erasing of the first memory block BLK1 is not completed, the nonvolatile memory device 100 executes a second erase loop EL2. In the erase step of the second erase loop EL2, the nonvolatile memory device 100 applies the second erase voltage Vers2 to the substrate SUB, floats the ground and string selection lines GSL and SSL, and applies the first voltage V1 to the word lines WL. Voltages of the ground and string selection lines GSL and SSL increase up to Vers2' and Vers2" due to coupling with the second erase voltage Vers2 that is supplied to the substrate SUB. Afterwards, the second erase voltage Vers2 that is supplied to the substrate SUB is discharged to the ground voltage Vss.

In exemplary embodiments, the second erase voltage Vers2 may be higher by an erase voltage increment ΔVers than the first erase voltage Vers1. The erase voltage increment ΔVers may be predetermined.

Afterwards, the nonvolatile memory device 100 performs a verification operation in the same manner as the verification operation of the first erase loop EL1.

The nonvolatile memory device 100 executes the third erase loop EL3 if a verification result of the second erase loop EL2 indicates an erase fail. In the erase step of the third erase loop EL3, the nonvolatile memory device 100 applies the third erase voltage Vers3 to the substrate SUB, floats the ground and string selection lines GSL and SSL, and applies the first voltage V1 to the word lines WL. Voltages of the ground and string selection lines GSL and SSL increase up to Vers3' and Vers3" due to coupling with the third erase voltage Vers3 that is supplied to the substrate SUB. Afterwards, the third erase voltage Vers3 that is supplied to the substrate SUB is discharged to the ground voltage Vss. In exemplary embodiments, the third erase voltage Vers3 may be higher by the erase voltage increment ΔVers than the second erase voltage Vers2. Afterwards, the nonvolatile memory device 100 performs a verification operation in the same manner as the verification operation of the first erase loop ELL In exemplary embodiments, the first through third erase voltages Vers1, Vers2, and Vers3 may have first through third pulse widths Ters1, Ters2, and Ters3, respectively. The first through third pulse widths Ters1, Ters2, and Ters3 may be predetermined. That is, erase voltages used in the erase loops may have predetermined magnitudes and pulse widths.

As described above, the nonvolatile memory device 100 performs erase loops where an erase voltage is increased by a predetermined erase increment such that memory cells of the first memory block BLK1 have a target erase state E. However, threshold voltages of memory cells of the first memory block BLK1 are distributed, as illustrated in FIG. 4 by an erase state E", due to physical characteristics and positions of memory cells and the memory block.

A distribution range of the erase state E" is greater than that of the target erase state E, and the lower limit of the distribution range corresponding to the erase state E" is lower than that corresponding to the target erase state E. The erase state E" is referred to as the "deep erase state." The deep erase state causes an increase in a program time and a decrease in data retention after programming.

Figure 5:
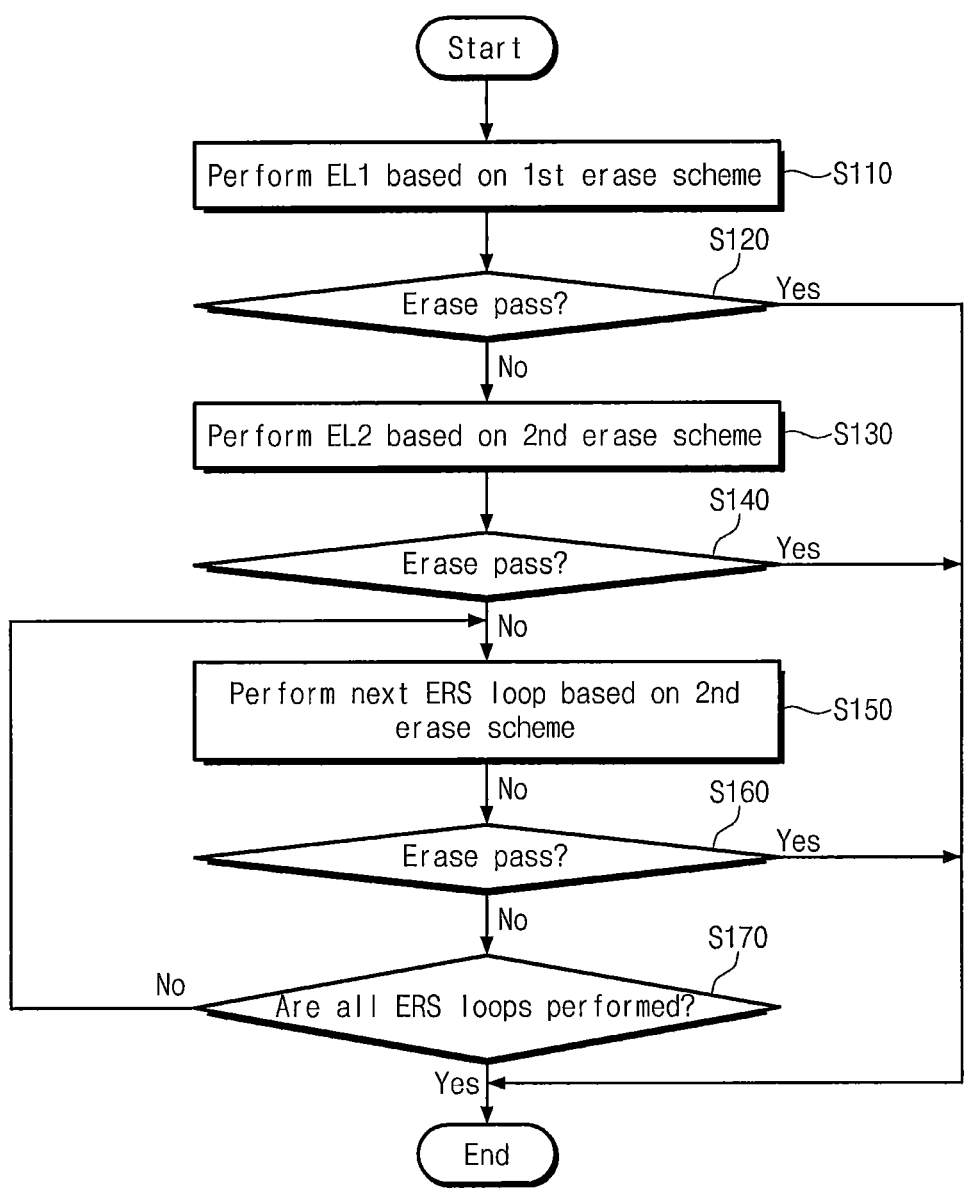
FIG. 5 is a flow chart showing an erase operation for a nonvolatile memory device according to an embodiment of the inventive concepts.

FIG. 5 is a flow chart showing an erase operation of a nonvolatile memory device according to an embodiment of the inventive concepts. Referring to FIGS. 1 and 5, in step S110, a nonvolatile memory device 100 performs a first erase loop EL1 based on a first erase scheme. For example, the nonvolatile memory device 100 may use the following erase schemes to narrow an erase distribution of a first memory block BLK1: pre-programming, post-programming, adjusting of an erase voltage increment, adjusting of a pulse width of an erase voltage, and adjusting of a word line voltage. The nonvolatile memory device 100 performs the first erase loop EL1, based on one (i.e., the first erase scheme) of the above-described erase schemes.

In step S120, the nonvolatile memory device 100 determines whether the first memory block BLK1 is erase-passed. In exemplary embodiments, the operation of step S120 may be included in the operation of step S110. In exemplary embodiments, the operation of step S120 may include the erase verification step described above with reference to FIG. 3.

If the first memory block BLK1 is not erase-passed, in step S130, the nonvolatile memory device 100 executes a second erase loop EL2 using a second erase scheme. For example, as described in step S110, the nonvolatile memory device 100 uses various erase schemes to narrow the erase distribution. The nonvolatile memory device 100 performs the second erase loop EL2 based on the second erase scheme that is different from the first erase scheme.

In step S140, the nonvolatile memory device 100 determines whether the first memory block BLK1 is erase-passed. In exemplary embodiments, the operation of step S140 may be included in the operation of step S130. In exemplary embodiments, the operation of step S140 may include the erase verification step that is described with reference to FIG. 3.

If the first memory block BLK1 is not erase-passed, in step S150, the nonvolatile memory device 100 executes another erase loop using the second erase scheme. In step S160, the nonvolatile memory device 100 determines whether the first memory block BLK1 is erase-passed. In exemplary embodiments, the operation of step S160 may be included in the operation of step S150.

When the first memory block BLK1 is not erase-passed, in step S170, the nonvolatile memory device 100 determines whether all of the erase loops have been executed. If not, the method proceeds to step S150. Afterwards, steps S150 through S170 are iterated until all erase loops are executed. Once all of the erase loops have been executed, the method ends.

In exemplary embodiments, the erase method ends when the memory block BLK1 is erase-passed during the execution of steps S110 through S170 or when all erase loops are executed. The flow chart of FIG. 5 illustrates one erase operation.

Figure 6:
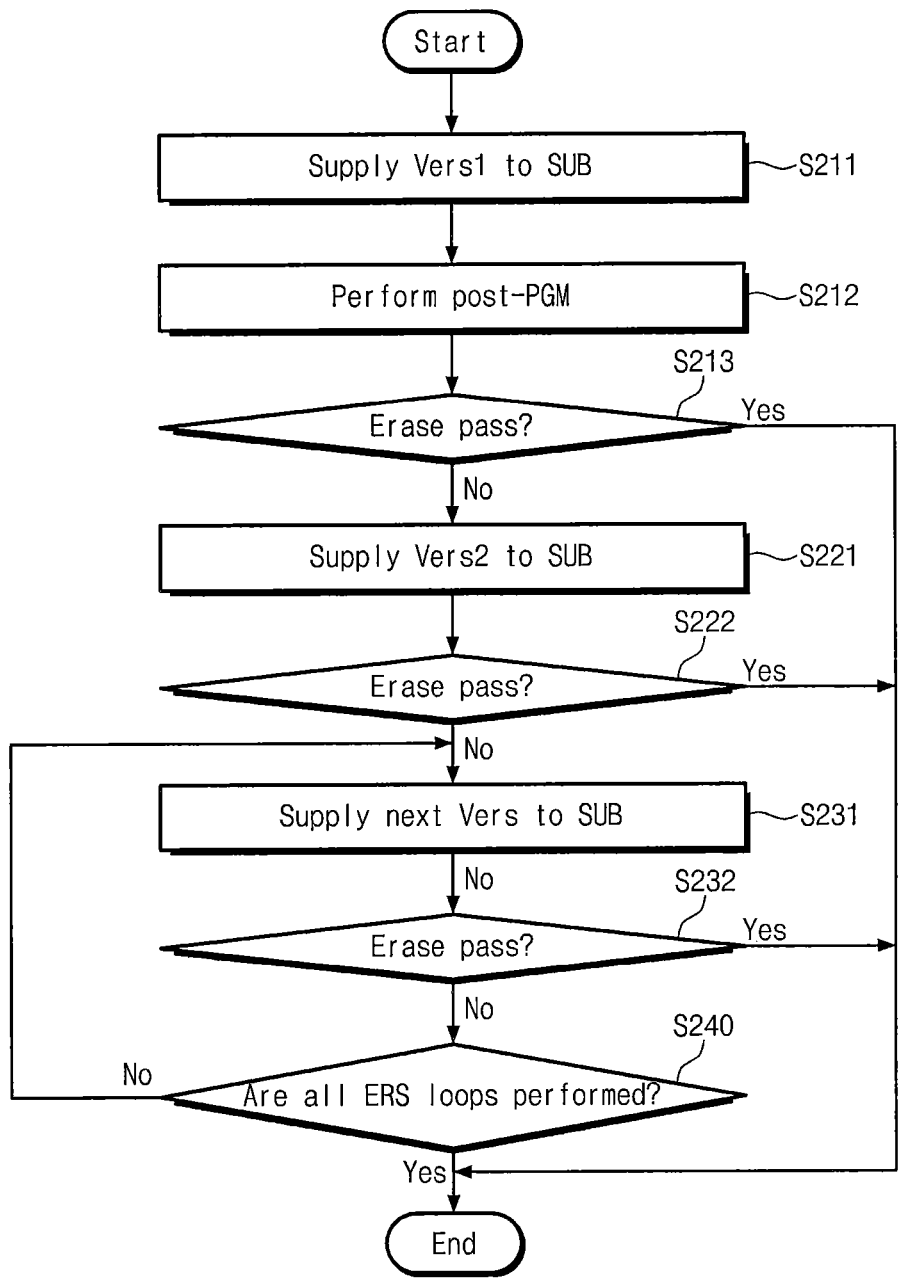
FIG. 6 is a flow chart illustrating an operating method for a nonvolatile memory device according to an embodiment of the inventive concepts.
Figure 7:
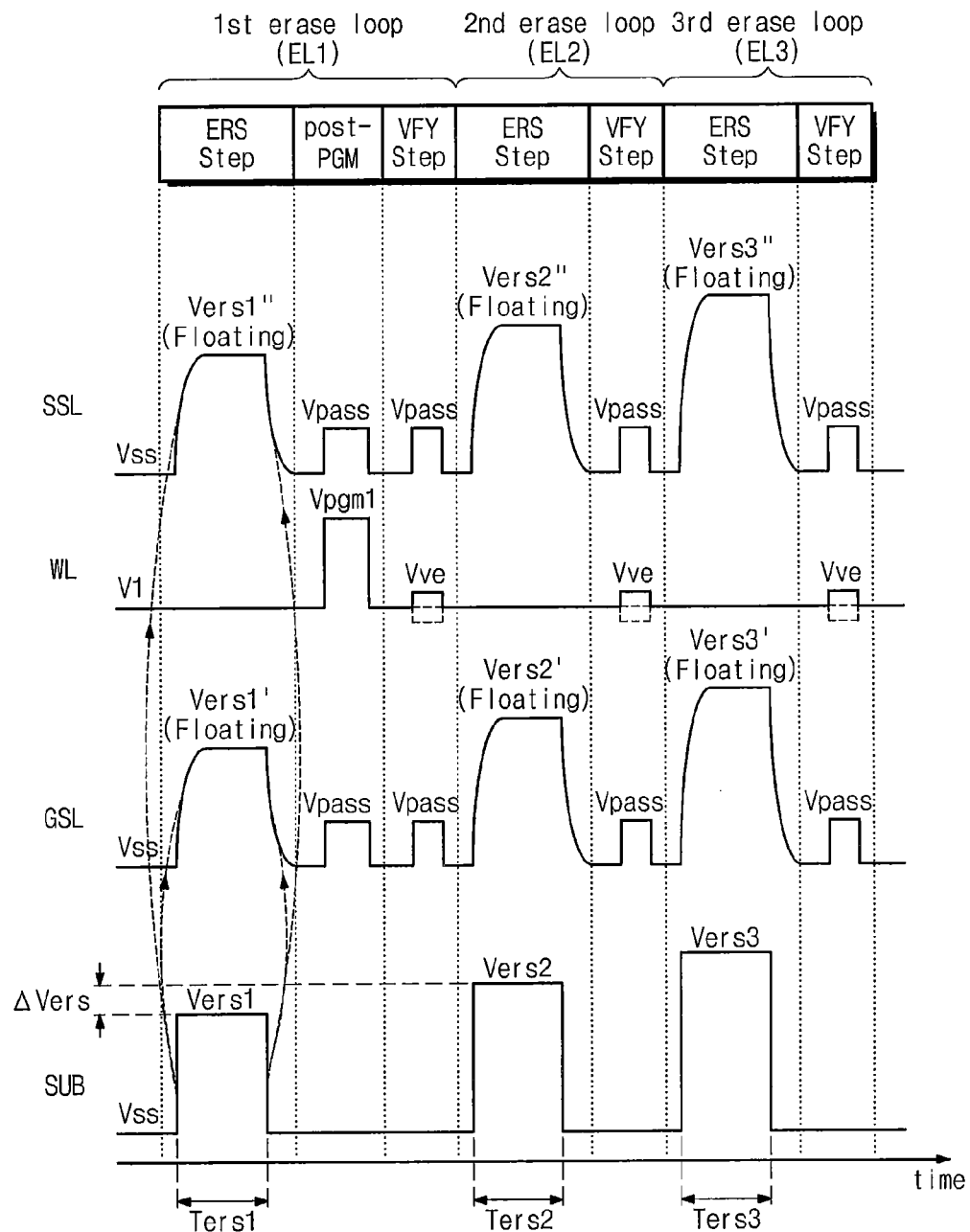
FIG. 7 is a timing diagram illustrating the operating method that is shown in FIG. 6.
Figure 8:
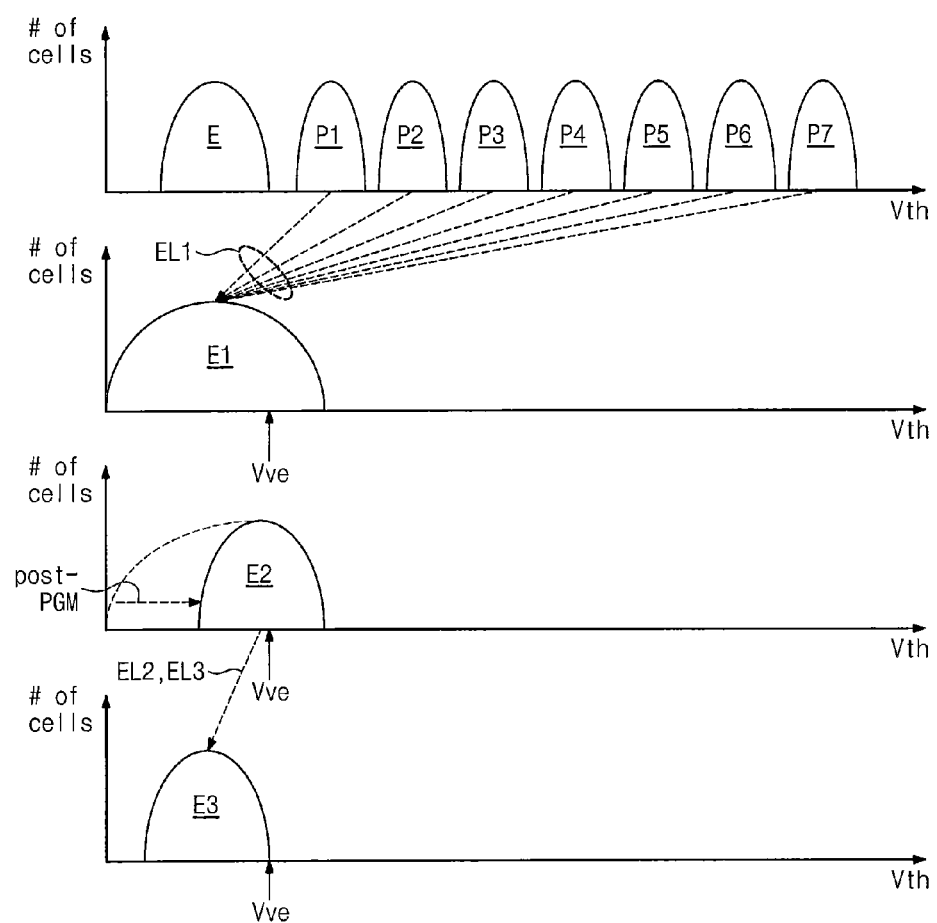
FIG. 8 is a distribution diagram showing threshold voltage distributions of memory cells formed according to the operating method shown in FIG. 6.

FIG. 6 is a flow chart illustrating a method of operating a nonvolatile memory device according to embodiments of the inventive concepts. FIG. 7 is a timing diagram illustrating the operating method shown in FIG. 6. FIG. 8 is a distribution diagram showing threshold voltage distributions of memory cells formed according to the operating method of FIG. 6. In FIG. 7, the horizontal axis represents time, and the vertical axis represents voltage. In FIG. 8, the horizontal axis represents the threshold voltage Vth, and the vertical axis represents the number of memory cells MC.

Embodiments of the inventive concepts will be described under the following assumption: a first memory block BLK1 is a memory block selected for erasing and erasing of the first memory block BLK1 is completed (or BLK1 is erase-passed) after first through third erase loops EL1 through EL3 are executed. However, the scope and spirit of the inventive concepts are not limited thereto. The erasing of the first memory block BLK1 may be passed before all three erase loops are executed or may not pass even after all three erase loops are executed.

Also, it is assumed that each memory cell of the first memory block BLK1 is a TLC that stores 3-bit data. However, the scope and spirit of the inventive concepts is not limited thereto. Further, it is assumed that a first erase scheme is a post-program scheme and a second erase scheme is a normal erase scheme. However, the scope and spirit of the inventive concepts may not be limited thereto.

It is assumed that the first erase loop EL1 uses the first erase scheme and the second and third erase loops EL2 and EL3 use the second erase scheme. However, the scope and spirit of the inventive concepts may not be limited thereto. For example, at least one erase loop may be performed using the first erase scheme, and the remaining erase loops may be performed using the second erase scheme.

Referring to FIGS. 1 and 6 through 8, the nonvolatile memory device 100 performs the first erase loop EL1 using the first erase scheme. For example, in step S211, the nonvolatile memory device 100 supplies a first erase voltage Vers1 to a substrate SUB as illustrated in FIG. 7. In response, memory cells of the first memory block BLK1 are erased to have a first erase state E1 as illustrated in FIG. 8. An erase step of the first erase loop EL1 is described with reference to FIG. 3, and a detailed description is thus omitted.

In step S212, the nonvolatile memory device 100 performs post-programming. For example, as illustrated in FIG. 7, memory cells of the first memory block BLK1 are post-programmed by applying a program voltage Vpgm1 to the word lines WL and a pass voltage Vpass to the string and ground selection lines SSL and GSL. In this example, the memory cells of the first memory block BLK1 are post-programmed to have a second erase state E2 as illustrated in FIG. 8. In exemplary embodiments, threshold voltages of the post-programmed memory cells are increased by a predetermined voltage. Alternatively, a range of a threshold voltage distribution (i.e., second erase state E2) of the post-programmed memory cells is narrower than a range of a previous threshold voltage distribution (i.e., first erase state E1) of the memory cells.

In step S213, the nonvolatile memory device 100 determines whether the first memory block BLK1 is erase-passed. For example, the nonvolatile memory device 100 applies voltages (refer to an erase verification step of a first erase loop EL1 shown in FIG. 7) to the string selection line SSL, the word lines WL, and the ground selection line GSL and determines whether the first memory block BLK1 is erase-passed.

If the first memory block BLK1 is not erase-passed, the nonvolatile memory device 100 performs the second erase loop EL2. For example, in step S221, the nonvolatile memory device 100 applies a second erase voltage Vers2 to the substrate SUB. The second erase voltage Vers2 may be higher by an erase voltage increment ΔVers than the first erase voltage Vers1. Afterwards, in step S222, the nonvolatile memory device 100 determines whether the first memory block BLK1 is erase-passed.

If the first memory block BLK1 is not erase-passed, the nonvolatile memory device 100 performs the third erase loop EL3. For example, in step S231, the nonvolatile memory device 100 applies a third erase voltage Vers3 to the substrate SUB. The third erase voltage Vers3 may be higher by the erase voltage increment ΔVers than the second erase voltage Vers2. Afterwards, in step S232, the nonvolatile memory device 100 determines whether the first memory block BLK1 is erase-passed.

As steps S221 through S232 are performed, memory cells of the first memory block BLK1 form a third erase state E3 shown in FIG. 8. The upper limit of an erase state of the third erase state E3 is lower than an erase verification voltage Vve. That is, the first memory block BLK1 is erase-passed. Afterwards, the nonvolatile memory device 100 terminates the erase operation.

In exemplary embodiments, a range of a threshold voltage distribution corresponding to the third erase state E3 is narrower than that corresponding to an erase state E" shown in FIG. 4. That is, an erase distribution may be improved by erasing the memory block using the erase method described with reference to FIGS. 6 through 8.

As described above, the nonvolatile memory device 100 sequentially performs erase loops to erase a memory block. The nonvolatile memory device 100 performs the first erase loop EL1 using a post-program scheme and performs the remaining erase loops EL2 and EL3 using a normal erase scheme. That is, post-programming is performed in at least one of the erase loops and is not performed in the remaining erase loops. Thus, an erase distribution of the memory cells may be improved without a significant loss of performance as compared to a conventional erase scheme.

In FIGS. 6 through 8, an embodiment of the inventive concepts is exemplified in which an erase verification operation is performed after post-programming. However, the scope and spirit of the inventive concepts may not be limited thereto. For example, the nonvolatile memory device 100 may perform an erase verification step of a first erase loop EL1 and may then performs a post-program operation in other embodiments. Alternatively, the nonvolatile memory device 100 may conduct a re-program operation on a first memory block BLK1 before performing the first erase loop ELL Although not shown in figures, the nonvolatile memory device 100 may perform a post-program operation after executing at least one of the erase loops.

Figure 9:
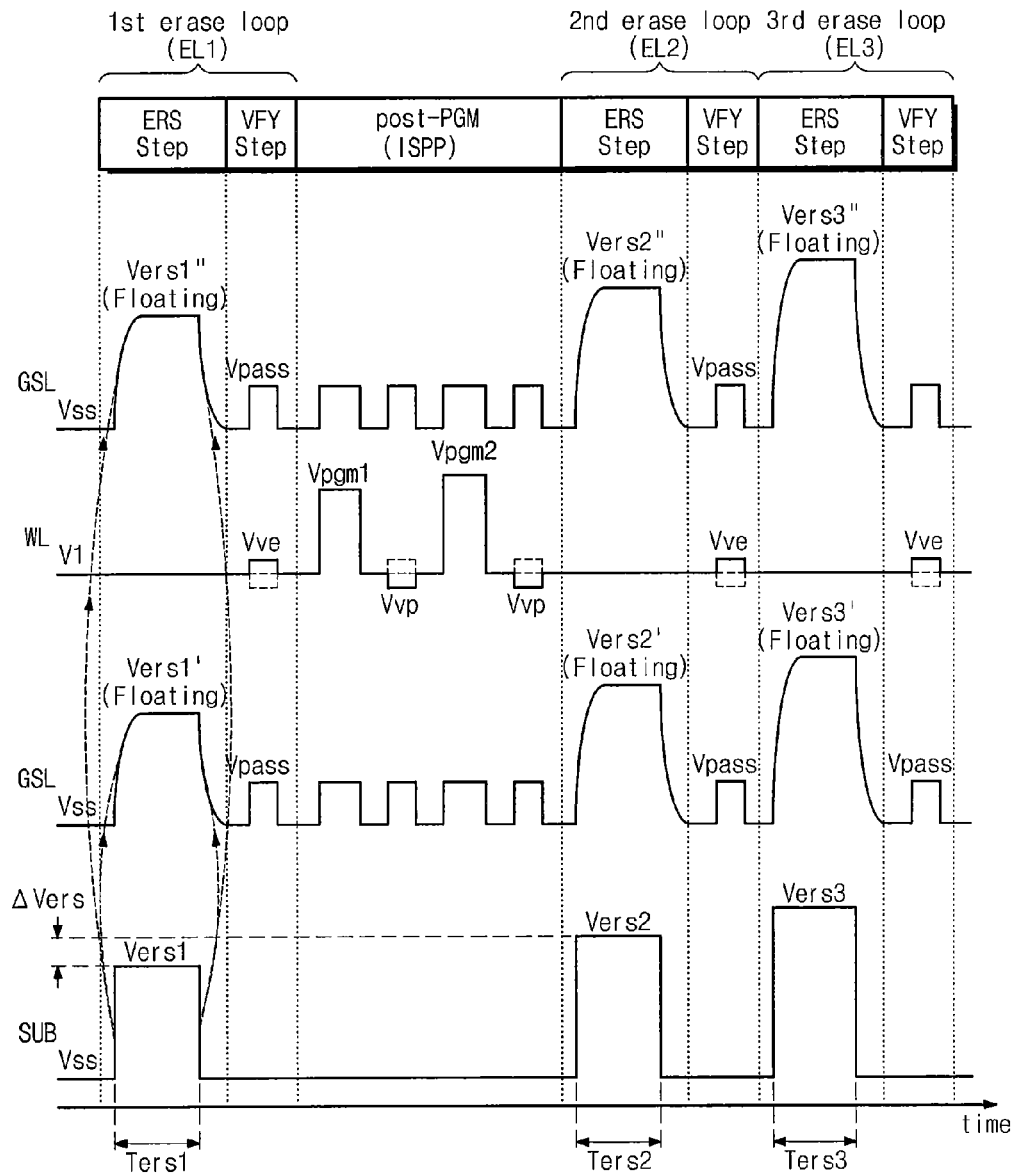
FIG. 9 is a timing diagram illustrating operation of a nonvolatile memory device according to another embodiment of the inventive concepts.
Figure 10:
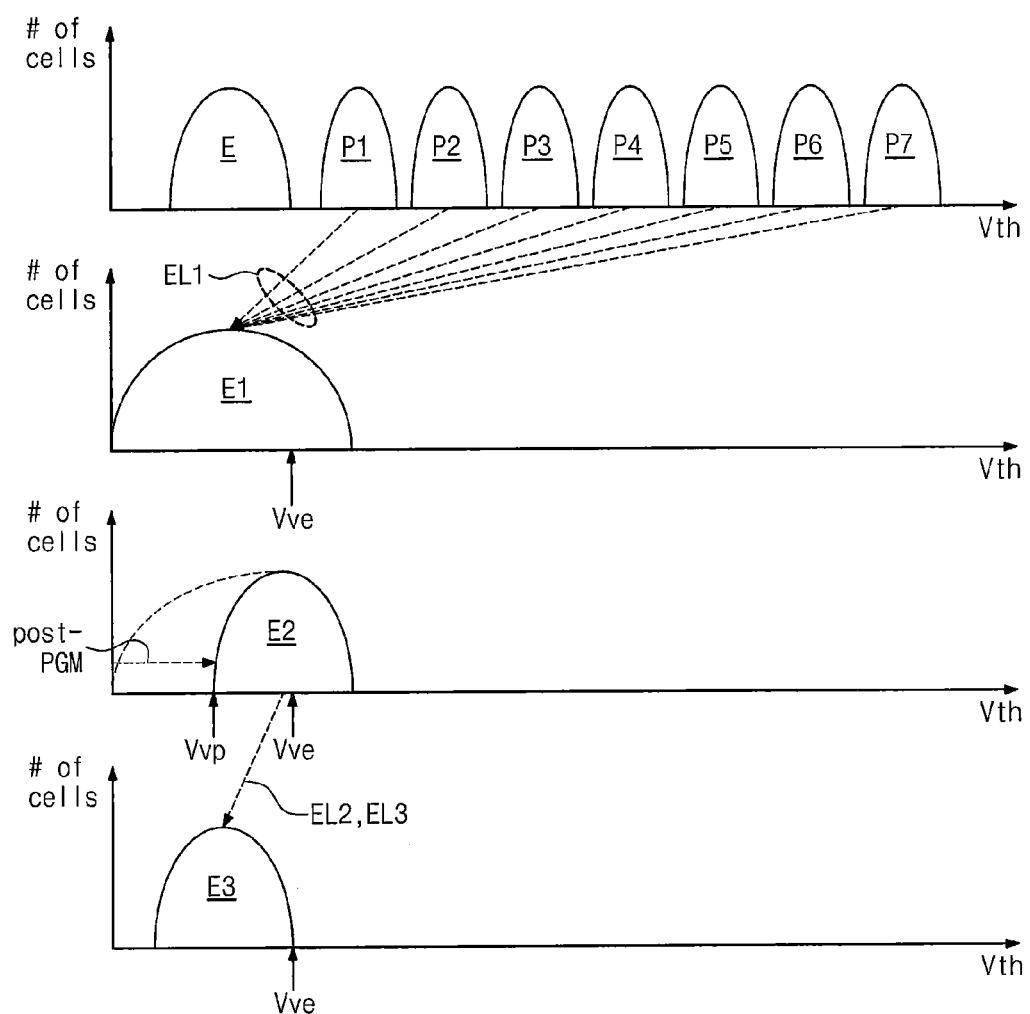
FIG. 10 is a distribution diagram showing threshold voltage distributions of memory cells formed according to the operating method of FIG. 9.

FIG. 9 is a timing diagram illustrating the operation of a nonvolatile memory device according to another embodiment of the inventive concepts. FIG. 10 is a distribution diagram showing threshold voltage distributions of memory cells realized when performing the operations of FIG. 9. In FIG. 9, the horizontal axis represents time, and the vertical axis represents voltage. Referring to FIGS. 1 and 9, a nonvolatile memory device 100 sequentially performs first through third erase loops EL1 through EL3 to erase a first memory block BLK1. The first through third erase loops EL1 through EL3 are described with reference to FIG. 3 and a detailed description thereof is thus omitted.

Referring to FIG. 9, the nonvolatile memory device 100 performs a post-program operation using an incremental step pulse programming (ISPP) technique. For example, the nonvolatile memory device 100 executes program loops to post-program the first memory block BLK1. Each of the program loops includes a program step where a program voltage is applied to a word line to program memory cells and a verification step where a program verification voltage is applied to verify program states of the memory cells.

As illustrated in FIG. 9, the nonvolatile memory device 100 iteratively applies a program voltage Vpgm and a program verification voltage Vvp to a word line to program memory cells of the first memory block BLK1 to a second erase state E2 shown in FIG. 10. A range of a threshold voltage distribution of the second erase state E2 is narrower than that of a first erase state E1. The lower limit of the threshold voltage distribution of the second erase state E2 is higher than the program verification voltage Vvp.

The nonvolatile memory device 100 applies the program verification voltage Vvp to a predetermined program reference word line P_ref WL to verify post-programmed memory cells.

The program reference word line P_ref WL may be one of word lines WL1 through WL9 of the first memory block BLK1 or may be a dummy word line added for post-programming.

The post-program operation ends when programming about the program reference word line P_ref WL is passed, and the second erase loop EL2 is executed. A level of the verification voltage Vvp may be lower than that of an erase verification voltage Vve. The verification voltage Vvp may be a positive voltage, a ground voltage, or a negative voltage. As described above, the post-program operation is executed using the ISPE technique, thereby improving an erase distribution.

Figure 11:
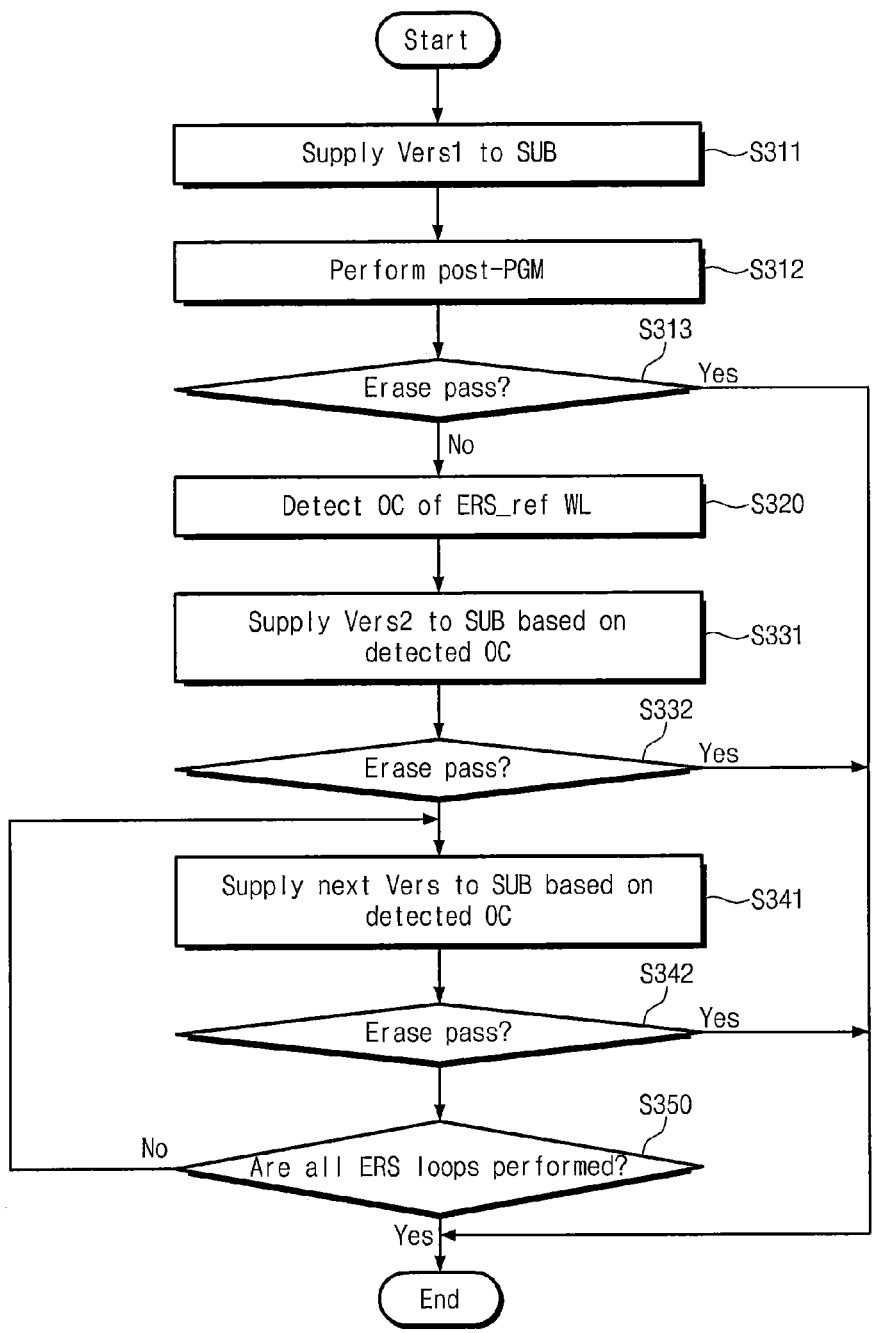
FIG. 11 is a flow chart showing a method of erasing a nonvolatile memory device according to still another embodiment of the inventive concepts.

FIG. 11 is a flow chart of a method of erasing a nonvolatile memory device according to still another embodiment of the inventive concepts. Steps S311 through S313 are the same as steps S211 through S213 of FIG. 6, and a detailed description thereof is thus omitted.

Referring to FIGS. 1 and 11, if a result of step S313 does not indicate an erase-pass state, in step S320, the nonvolatile memory device 100 detects off cells among the memory cells that are connected to an erase reference word line ERS_ref WL. For example, the nonvolatile memory device 100 applies an off cell voltage Voc to the erase reference word line ERS_ref WL, applies a pass voltage Vpass to the remaining word lines, a ground selection line GSL, and a string selection line SSL, and detects those of the memory cells that are connected to the erase reference word line ERS_ref WL that are off cells. An off cell may indicate a memory cell that has a threshold voltage higher than the off cell voltage Voc. In exemplary embodiments, the erase reference word line ERS_ref WL may be at least one of word lines WL1 through WL9 of the first memory block BLK1.

In step S331, the nonvolatile memory device 100 applies a second erase voltage Vers2 to the substrate SUB based on the number of off cells OC detected. For example, the number of off cells OC detected in step S320 may include information about a threshold voltage distribution of memory cells connected to the erase reference word line ERS_ref WL. In other words, the number of off cells OC indicates the number of memory cells that are not sufficiently erased to have a threshold voltage in a desired "erase" range.

The nonvolatile memory device 100 adjusts an erase voltage increment ΔVers based on the number of off cells OC detected. For example, the erase voltage increment ΔVers may increase or decrease with an increase or decrease in the number of off cells OC detected. The nonvolatile memory device 100 supplies the second erase voltage Vers2 to the substrate SUB. The level of the second erase voltage Vers2 is based on the adjusted erase voltage increment ΔVers'. That is, a level of the second erase voltage Vers2 is higher than that of the first erase voltage Vers1 by the adjusted erase voltage increment ΔVers'. In exemplary embodiments, the adjusted erase voltage increment ΔVers' may be different from the predetermined erase voltage increment ΔVers that is discussed above with reference to FIGS. 3 through 7.

In step S332, the nonvolatile memory device 100 determines whether the erasing of the first memory block BLK1 is passed. If the erasing of the first memory block BLK1 is not passed, in step S341, the nonvolatile memory device 100 applies a next erase voltage to the substrate SUB that is based on the number of off cells OC detected. For example, the nonvolatile memory device 100 applies a third erase voltage Vers3 to the substrate SUB. A level of the third erase voltage Vers3 is higher than that of the second erase voltage Vers2 by the adjusted erase voltage increment ΔVers'.

Afterwards, steps S342 and S350 that are the same as steps S232 and S240 of FIG. 6 are executed and a description thereof is omitted.

As described above, the nonvolatile memory device 100 performs a first erase loop EL1 using a first erase scheme (e.g., post-program scheme) and then executes the remaining erase loops EL2 and EL3 using a second erase scheme (e.g., controlling an erase voltage increment), thereby improving an erase distribution of the first memory block BLK1.

Even though an erase voltage applied to the first memory block BLK1 is the same as an erase voltage applied to other memory blocks, an erase distribution of memory cells of the first memory block BLK1 may be different from that of the other memory blocks due to physical characteristics and/or a position of the first memory block BLK1. An erase voltage increment ΔVers may be adjusted based on a result of detecting a threshold voltage distribution (or, off cells) of the first memory block BLK1 during the erase operation (i.e., before execution of a second erase loop EL2), thereby improving an erase distribution of the first memory block BLK1.

Figure 12:
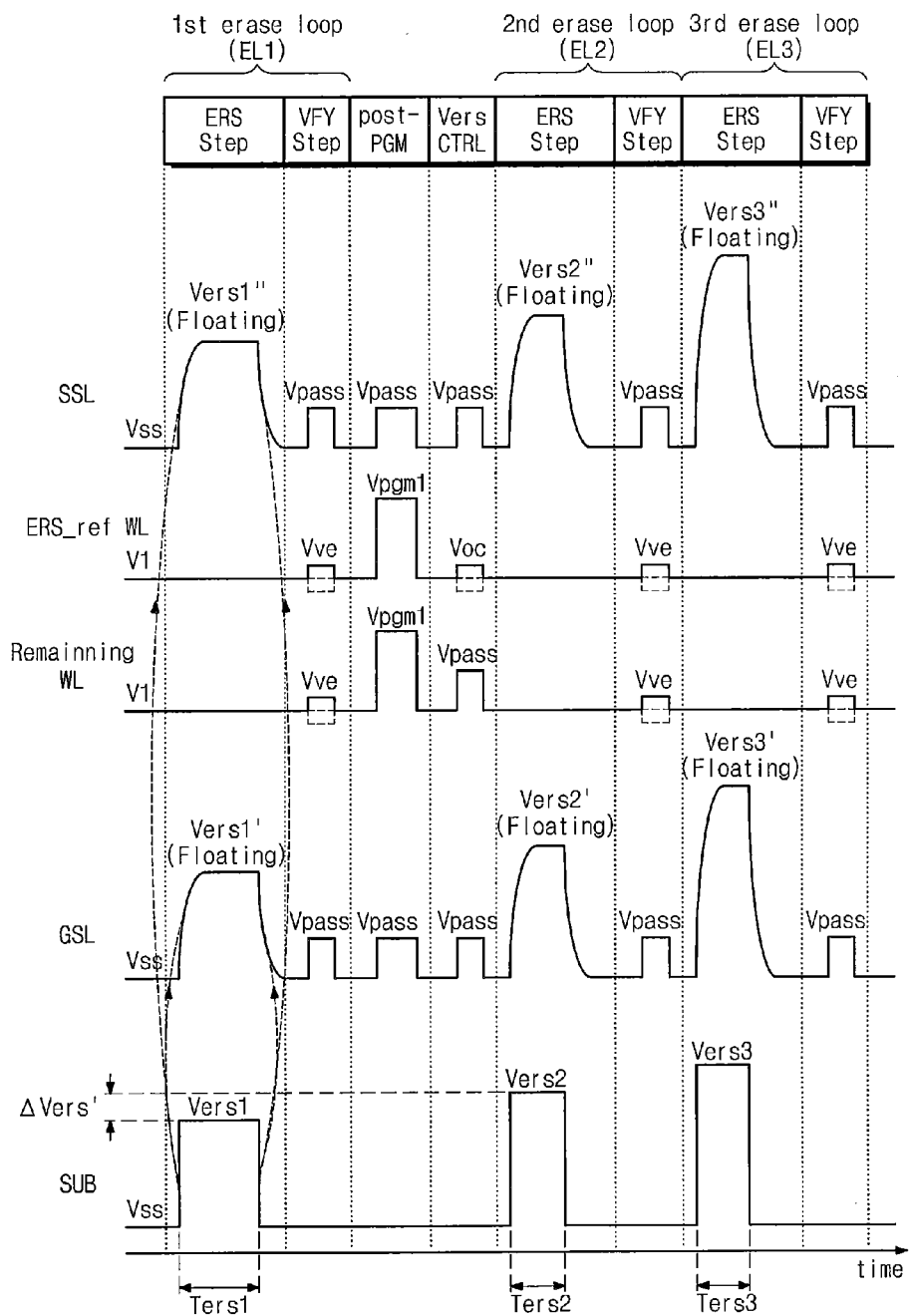
Figure 13:
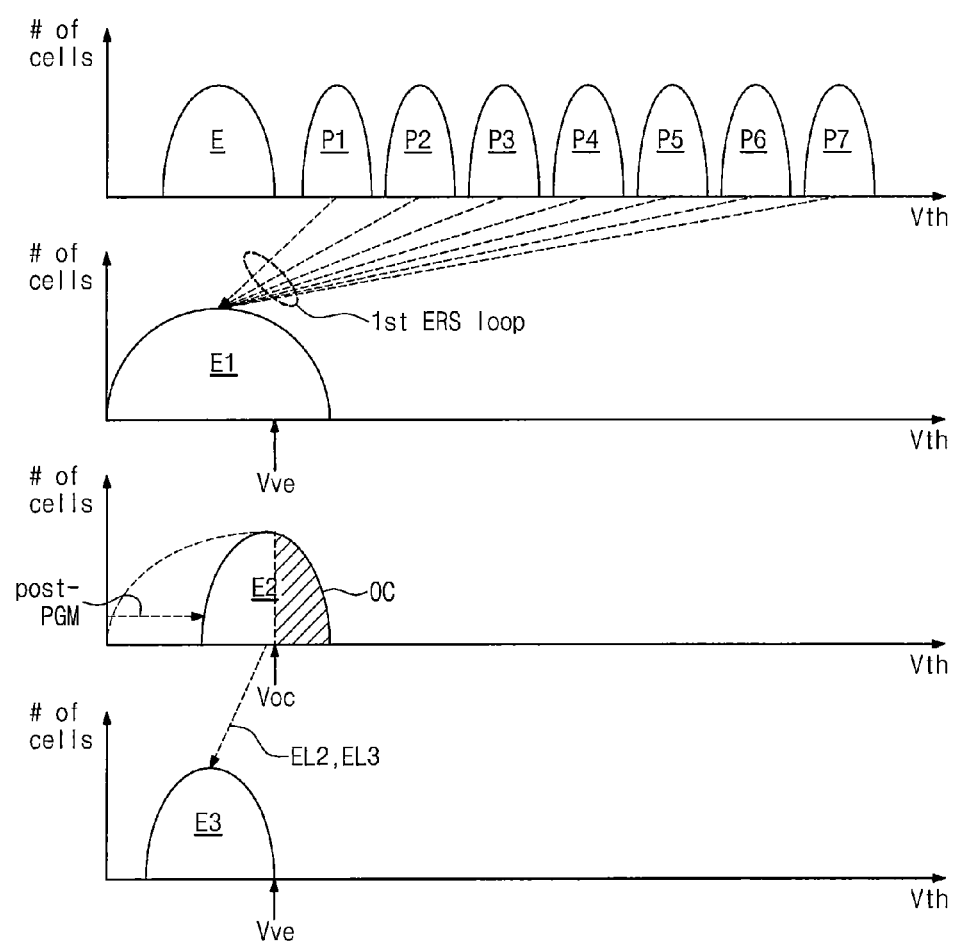

FIGS. 12 through 14 are diagrams for describing a method of operating a nonvolatile memory device according to the method shown in FIG. 11. In particular, FIG. 12 is a timing diagram illustrating the method for operating the nonvolatile memory device. FIG. 13 is a distribution diagram for describing an operating method of a nonvolatile memory device. FIG. 14 is a diagram showing a look-up table that is included in the nonvolatile memory device. Embodiments of the inventive concepts will be described under the following assumptions: the first memory block BLK1 is the selected memory block, and erasing of the first memory block BLK1 is completed (or, BLK1 is erase passed) after a third erase loop EL3 is executed. However, the scope and spirit of the inventive concepts may not be limited thereto. For example, the erasing of the first memory block BLK1 may be completed before all three erase loops are executed and thereby is terminated. Alternatively, the first memory block BLK1 may not be erased after all three erase loops are performed.

It is assumed that memory cells of the first memory block BLK1 are TLCs. However, the scope and spirit of the inventive concepts is not limited thereto.

Referring to FIGS. 1 and 11 through 14, the nonvolatile memory device 100 performs a first erase loop EL1 and then executes a post-program operation. The first erase loop EL1 and the post-program operation are described with reference to FIGS. 5 through 10, and a detailed description thereof is thus omitted.

During an erase voltage control step Vers CTRL (see FIG. 12) of the first erase loop EL1, the nonvolatile memory device 100 detects off cells (or, the number of off cells), having threshold voltages that are higher than an off cell voltage Voc, from among the memory cells that are connected to an erase reference word line ERS_ref WL under the following conditions: the off cell voltage Voc is applied to the erase reference word line ERS_ref WL, and a pass voltage Vpass is applied to the remaining word lines, a string selection line SSL, and a ground selection line GSL.

For example, as illustrated in FIG. 13, after the first erase loop EL1 is executed, memory cells of the first memory block BLK1 have a first erase state E1. Afterwards, post-programmed memory cells have a second erase state E2. At this time, the nonvolatile memory device 100 performs a read operation about the erase reference word line ERS_ref WL using the off cell voltage Voc and detects memory cells (i.e., off cells) that have a threshold voltage higher than the off cell voltage Voc. In exemplary embodiments, a level of the off cell voltage Voc may be the same as that of an erase verification voltage Vve. Alternatively, a level of the off cell voltage Voc may be higher or lower than that of an erase verification voltage Vve.

In exemplary embodiments, the erase reference word line ERS_ref WL may be at least one predetermined word line of word lines of the first memory block BLK1. Although not shown in figures, when the number of erase reference word lines is 2 or more, the nonvolatile memory device 100 sequentially applies the off cell voltage Voc to the two or more erase reference word lines to detect off cells of each of the erase reference word lines.

Afterwards, the nonvolatile memory device 100 adjusts an erase voltage increment ΔVers based on the number of off cells OC detected. For example, the nonvolatile memory device 100 includes a look-up table LUT shown in FIG. 14. The look-up table LUT may be stored at a separate storage circuit (not shown) of the nonvolatile memory device 100 or may be included in a control logic and voltage generator block 130 (refer to FIG. 1).

The look-up table LUT includes information about a relationship between the number of off cells OC and an erase voltage increment ΔVers. The nonvolatile memory device 100 adjusts the erase voltage increment ΔVers based on the number of off cells OC detected and the look-up table LUT.

For example, if the number of off cells OC increases, this may indicate that the first memory block BLK1 includes many memory cells that were not erased to a desired threshold voltage. If the number of off cells OC decreases, this may indicate that the first memory block BLK1 includes few memory cells that were not erased to the desired threshold voltage. When the first memory block BLK1 includes many memory cells that were not erased to the desired threshold voltage, a higher erase voltage may be needed to more quickly complete an erase operation. In this case, a range of a threshold voltage distribution of erased memory cells may widen due to the higher erase voltage. Thus, the nonvolatile memory device 100 adjusts the erase voltage increment ΔVers using the look-up table LUT such that the erase voltage increment ΔVers increases with an increase in the number of off cells and such that the erase voltage increment ΔVers decreases with a decrease in the number of off cells.

In an erase step ERS step of the second erase loop EL2 shown in FIG. 12, the nonvolatile memory device 100 supplies a second erase voltage Vers2 to the substrate SUB that is based on the adjusted erase voltage increment ΔVers'. The second erase voltage Vers2 may be higher than the first erase voltage Vers1 by the adjusted erase voltage increment ΔVers'. Afterwards, in the third erase loop EL3, the nonvolatile memory device 100 supplies the substrate SUB with a third erase voltage Vers3 that is higher than the second erase voltage Vers2 by the adjusted erase voltage increment ΔVers'. The second and third erase loops EL2 and EL3 are described with reference to FIGS. 5 through 10, and a detailed description is thus omitted.

As described above, the nonvolatile memory device 100 executes the first erase loop EL1 using a first erase scheme (e.g., post-program scheme) and then performs the remaining erase loops using a second erase scheme (e.g., controlling an erase voltage increment), thereby improving an erase distribution of the erased memory block. In detail, the nonvolatile memory device 100 may perform a post-program operation after the first erase loop EL1. Afterwards, the nonvolatile memory device 100 detects off cells among memory cells connected to an erase reference word line ERS_ref WL using an off cell voltage Voc. In other words, the nonvolatile memory device 100 detects a threshold voltage distribution of memory cells connected to the erase reference word line ERS_ref by detecting the number of off cells. The nonvolatile memory device 100 adjusts an erase voltage increment ΔVers based on the detected threshold voltage distribution. The nonvolatile memory device 100 may perform subsequent erase loops using the adjusted erase voltage increment ΔVers'.

Although not shown in figures, an erase voltage increment may be again adjusted in the same manner after a second erase loop EL2 is executed. That is, a difference between first and second erase voltages Vers1 and Vers2 may be different from a difference between second and third erase voltages Vers2 and Vers3.

An erase voltage pulse width Ters may also be adjusted when the erase voltage increment ΔVers is adjusted. For example, the look-up table LUT may include a relationship between the number of off cells and an erase voltage pulse width Ters. Based on the number of off cells detected, the nonvolatile memory device 100 may adjust the erase voltage pulse widths Ters2 and Ters3 when adjusting the second and third erase voltages Vers2 and Vers3 shown in FIG. 12. For example, pulse widths Ters2 and Ters3 of the erase voltages Vers2 and Vers3 may increase or decrease with the number of off cells detected. In exemplary embodiments, the pulse widths Ters2 and Ters3 of the erase voltages Vers2 and Vers3 may increase with an increase in the number of off cells and may decrease with a decrease in the number of off cells.

In exemplary embodiments, the nonvolatile memory device 100 may perform an erase voltage adjusting step Vers CTRL to detect on cells, not off cells. An on cell may be a memory cell that has a threshold voltage lower than a reference voltage (i.e., off cell voltage). In this case, the nonvolatile memory device 100 may adjust an erase voltage increment ΔVers or a pulse width Ters of an erase voltage in a manner similar to that described above. For example, an erase voltage increment ΔVers or a pulse width Ters of an erase voltage may decrease with an increase in the number of on cells and may increase with a decrease in the number of on cells. Since cells will either be on cells or off cells, detection of the number of on cells also results in detection of the number of off cells.

Figure 15:
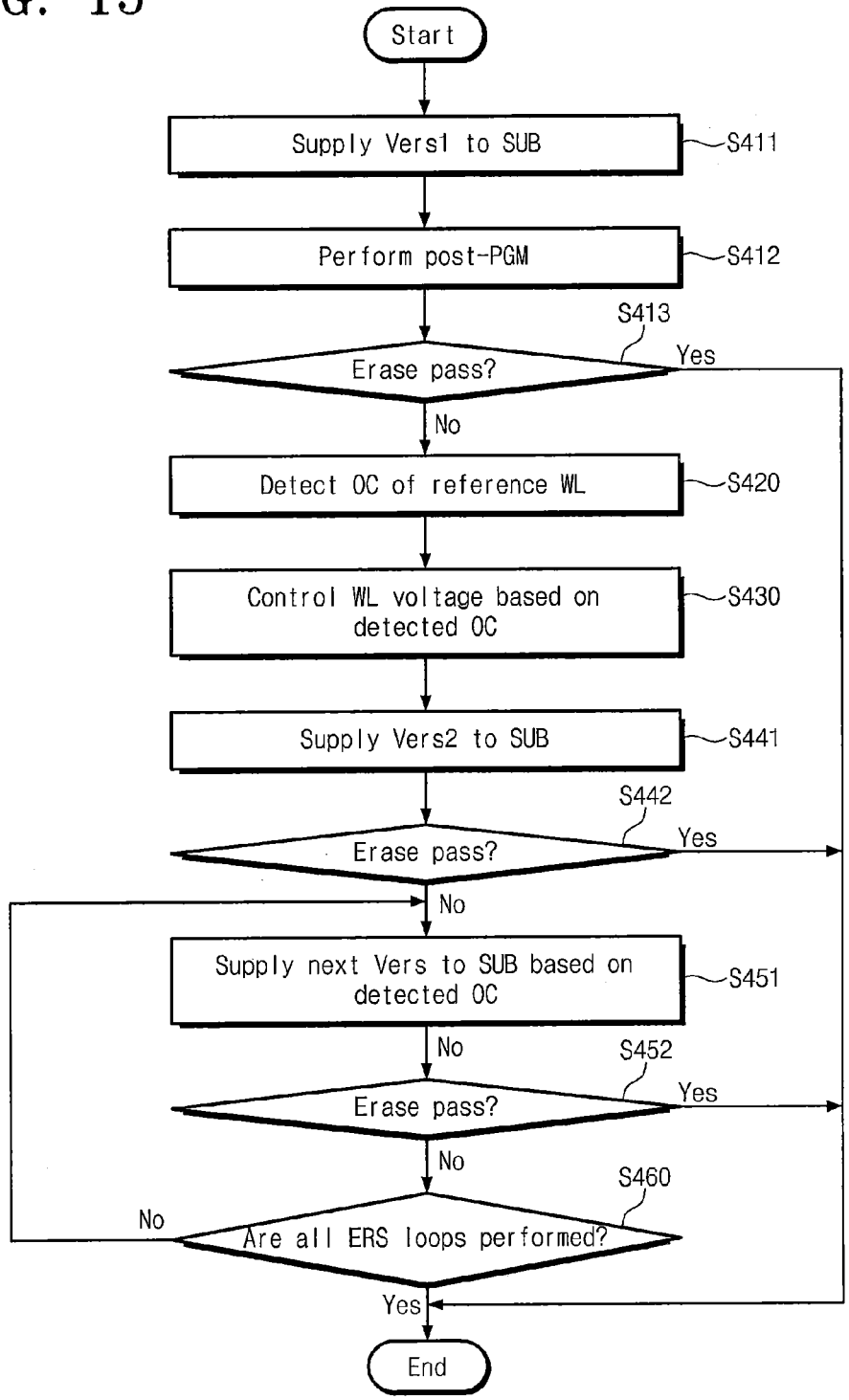
FIG. 15 is a flow chart showing an operating method of a nonvolatile memory device according to still another embodiment of the inventive concepts.

FIG. 15 is a flow chart showing a method of operating a nonvolatile memory device according to still another embodiment of the inventive concepts. Steps S411, S412, S413, and S420 are the same as steps S311, S312, S313, and S320 of FIG. 11, and a detailed description thereof is thus omitted.

In step S430, a nonvolatile memory device 100 adjusts a word line voltage based on the number of off cells detected. As described with reference to FIGS. 11 through 14, the nonvolatile memory device 100 adjusts an erase voltage increment ΔVers based on the number of off cells detected.

The nonvolatile memory device 100 does not adjust an erase voltage increment to be used in following erase loops, but it adjusts a word line voltage. For example, when an adjusted erase voltage increment ΔVers' that is determined based on the number of off cells is greater than a predetermined erase voltage increment ΔVers, the nonvolatile memory device 100 applies a negative voltage to the word lines. When the adjusted erase voltage increment ΔVers' that is determined based on the number of off cells is smaller than the predetermined erase voltage increment ΔVers, the nonvolatile memory device 100 applies a positive voltage to the word lines. When the adjusted erase voltage increment ΔVers' that is determined based on the number of off cells is the same as the predetermined erase voltage increment ΔVers, the nonvolatile memory device 100 applies a ground voltage to the word lines. In exemplary embodiments, each of voltages applied to the word lines is different from each other according to physical positions of the word lines, or cell sizes of memory cells connected to the word lines.

In step S441, the nonvolatile memory device 100 applies a second erase voltage Vers2 to the substrate SUB. A level of the second erase voltage Vers2 is higher than that of a first erase voltage Vers1 by the predetermined erase voltage increment ΔVers. However, because a word line voltage is adjusted based on the number of off cells detected in step S430, an erase voltage that is practically used for memory cells of a first memory block BLK1 may be higher than the first erase voltage Vers1 by the adjusted erase voltage increment ΔVers'.

Afterwards, steps S442, S451, S452, and S460 that are the same as steps S332, S341, S342, and S350 of FIG. 11 are executed, and a detailed description thereof is thus omitted.

Figure 16:
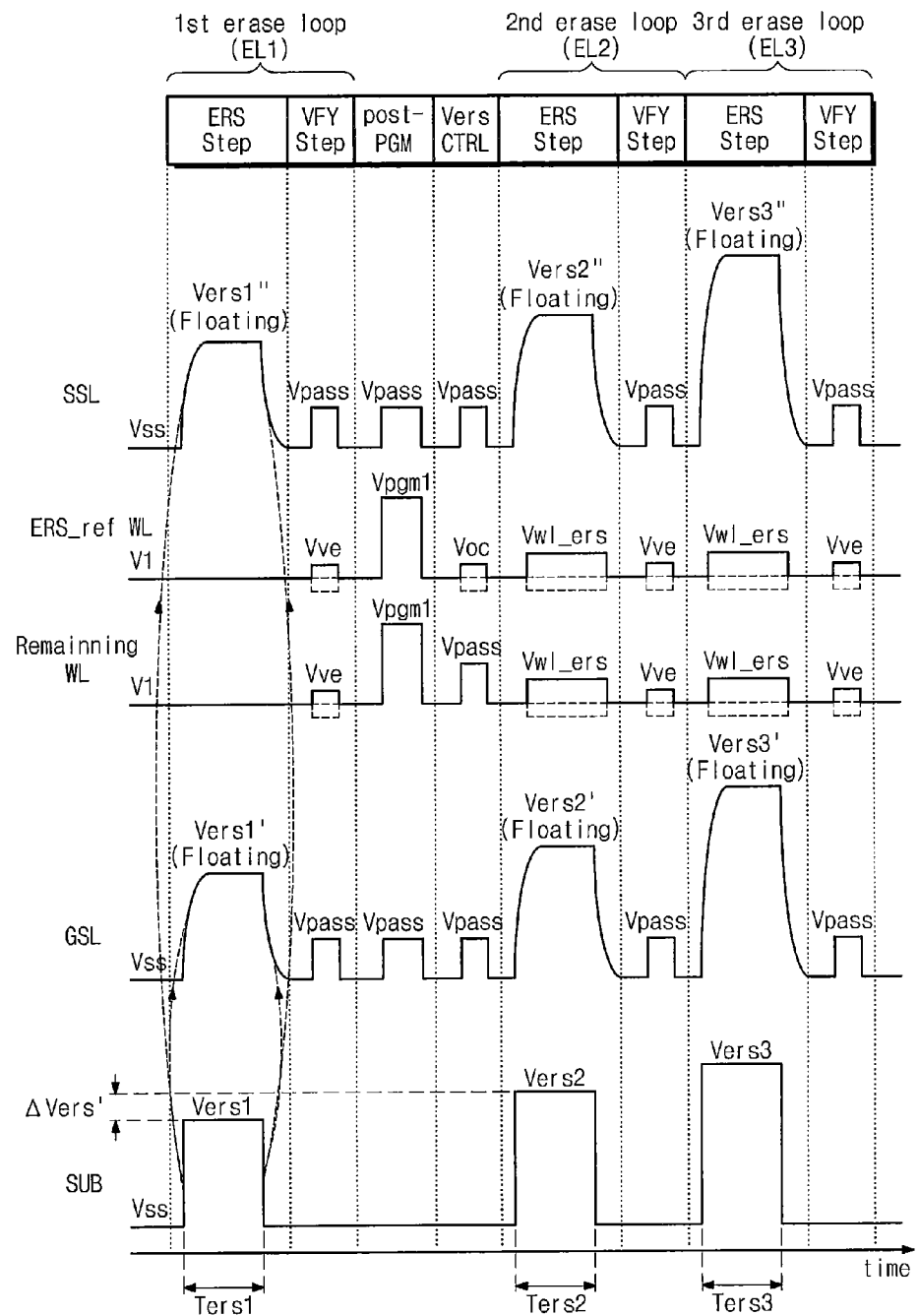
FIG. 16 is a timing diagram illustrating the method of operating the nonvolatile memory device shown in FIG. 15.

FIG. 16 is a timing diagram corresponding to the method of operating a nonvolatile memory of FIG. 15. Referring to FIGS. 1, 15, and 16, the nonvolatile memory device 100 executes a first erase loop EL1, post-programming, and erase voltage controlling Vers CTRL. The first erase loop EL1, post-programming, and erase voltage controlling Vers CTRL are described with reference to FIGS. 3 through 14, and a detailed description thereof is thus omitted.

As illustrated in FIG. 16, in an erase step of a second erase loop EL2, the nonvolatile memory device 100 applies a word line erase voltage Vwl_ers to an erase reference word line ERS_ref WL and to the remaining word lines. The word line erase voltage Vwl_ers may have a level that is set based on the number of off cells detected in the erase voltage controlling Vers CTRL. For example, the word line erase voltage Vwl_ers may be a positive voltage, a ground voltage, or a negative voltage.

At this time, the nonvolatile memory device 100 supplies a second erase voltage Vers2 to the substrate SUB. A level of the second erase voltage Vers2 is higher than that of a first erase voltage Vers1 by the predetermined erase voltage increment ΔVers. That is, the nonvolatile memory device 100 does not adjust the erase voltage increment ΔVers, but it adjusts an erase voltage to be practically applied to memory cells in the erase step by adjusting a word line voltage. Afterwards, the nonvolatile memory device 100 performs a third erase loop EL3 in a manner similar to the second erase loop EL2.

As described above, the nonvolatile memory device 100 performs a first erase loop EL1 using a first erase scheme (e.g., post-programming) and then executes the remaining erase loops using a second erase scheme (e.g., controlling a word line voltage), thereby improving an erase distribution of an erase memory block. Thus, a nonvolatile memory device with improved reliability is provided.

Figure 17:
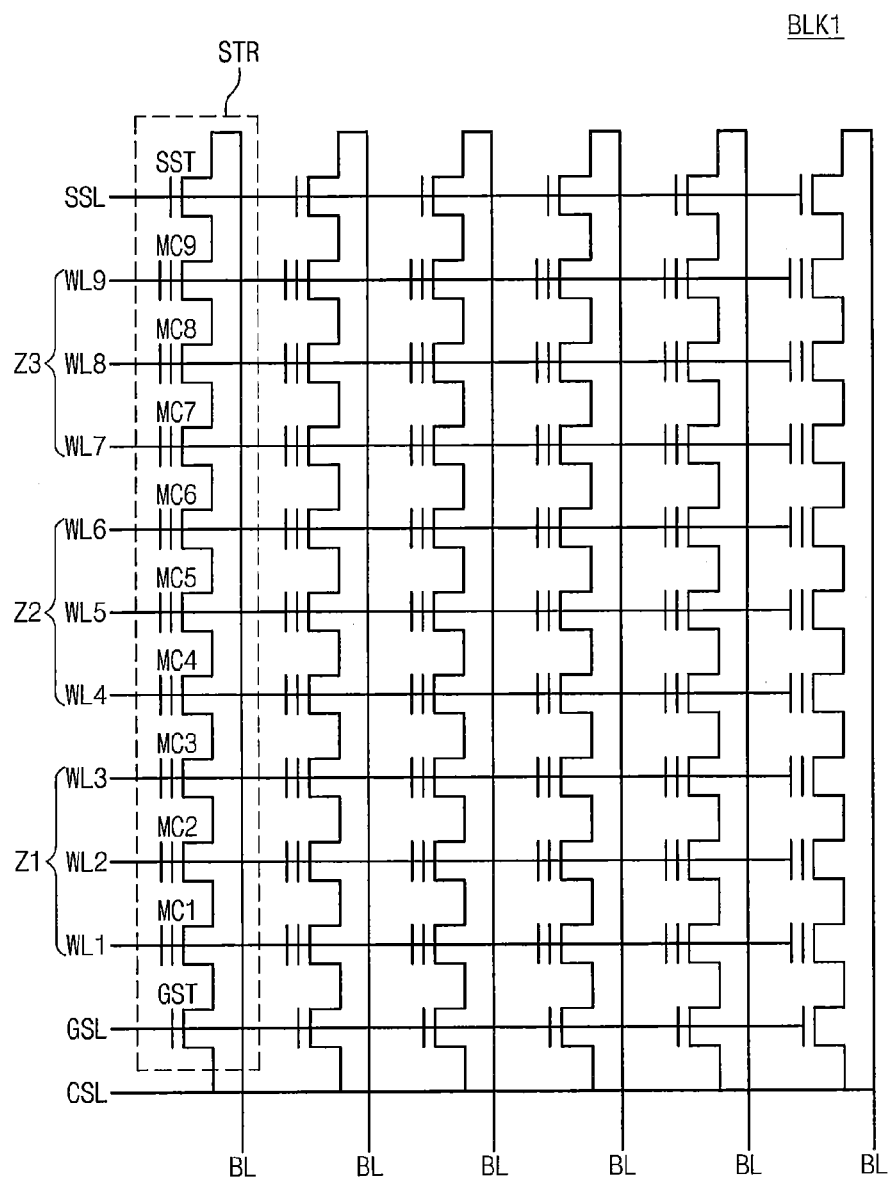
FIGS. 17 and 18 are diagrams for describing operation of a nonvolatile memory device according to still another embodiment of the inventive concepts.
Figure 18:
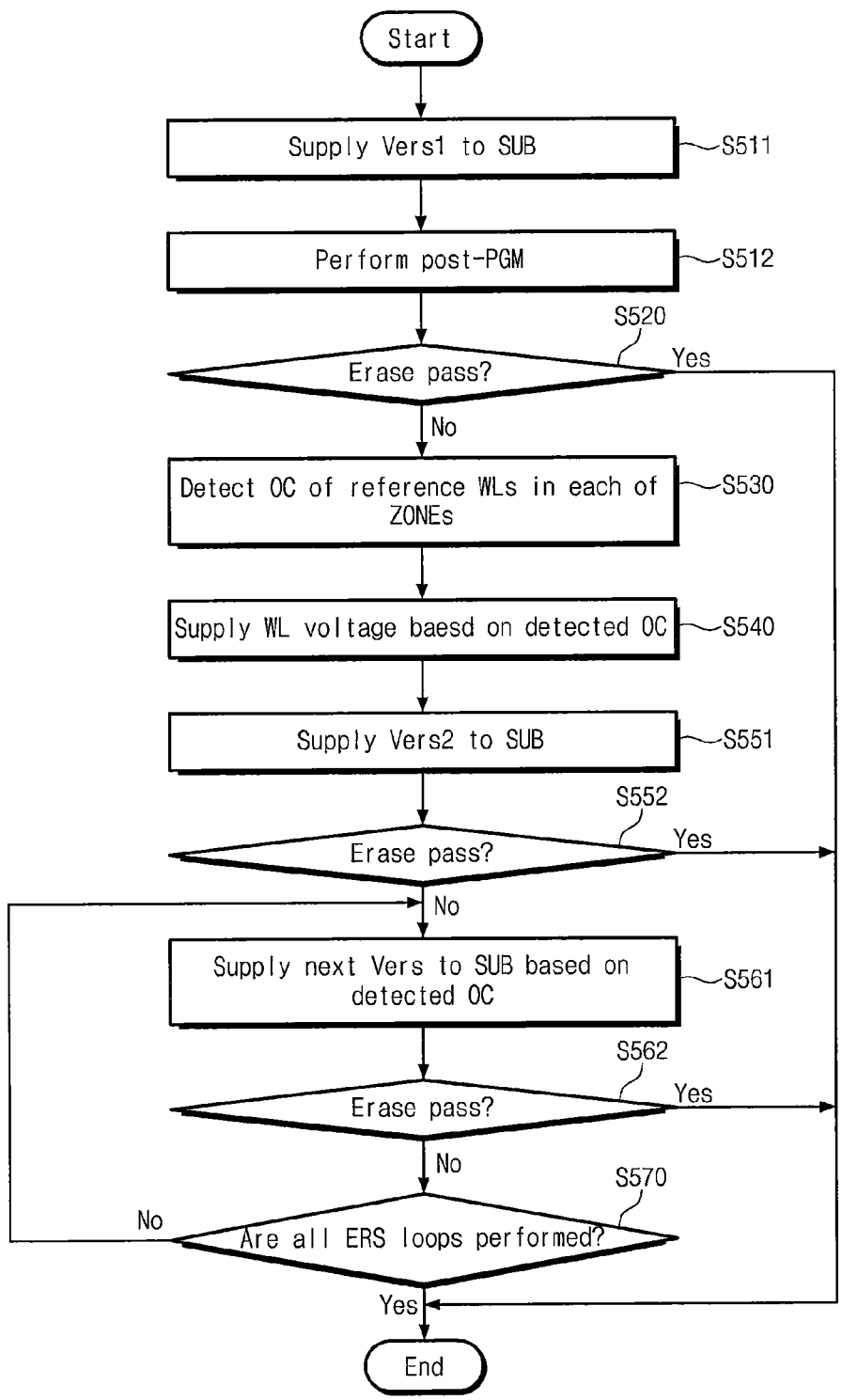

FIGS. 17 and 18 are diagrams illustrating operation of a nonvolatile memory device according to still another embodiment of the inventive concepts. In particular, FIG. 17 is a circuit diagram showing a first memory block BLK1, and FIG. 18 is a flow chart illustrating an operation of the nonvolatile memory device 100.

The first memory block BLK1 shown in FIG. 17 is described with reference to FIG. 2, and a detailed description thereof is thus omitted. Referring to FIGS. 1 and 17, the first memory block BLK1 is connected to a plurality of word lines WL1 through WL9. As shown in FIG. 17, the first memory block BLK1 is divided into a plurality of zones. For example, memory cells that are connected to the first through third word lines WL1 through WL3 are classified as a first zone Z1, memory cells that are connected to the fourth through sixth word lines WL4 through WL6 are classified as a second zone Z2, and memory cells that are connected to the seventh through ninth word lines WL7 through WL9 are classified as a third zone Z3. The first memory block BLK1 may be divided into a plurality of zones, based on a physical position and characteristics of the first memory block BLK1 or physical positions and characteristics of the memory cells.

In exemplary embodiments, each of the zones Z1 through Z3 may indicate a sub block. Alternatively, each of the zones Z1 through Z3 may indicate an erase unit of the nonvolatile memory device 100.

Referring to FIGS. 1, 17, and 18, the nonvolatile memory device 100 performs steps S511, S512, S520, and S530. Steps S511, S512, and S520 are the same as steps S311, S312, and S320, and a detailed description thereof is thus omitted.

In step S530, the nonvolatile memory device 100 detects the number of off cells of an erase reference word line ERS_ref WL of each of the zones Z1 through Z3. For example, as described with reference to FIG. 17, the first memory block BLK1 is divided into zones Z1 through Z3. Each of the zones Z1 through Z3 may include an erase reference word line ERS_ref WL. For example, an erase reference word line ERS_ref WL of the first zone Z1 may be a first word line WL1, an erase reference word line ERS_ref WL of the second zone Z2 may be a fourth word line WL4, and an erase reference word line ERS_ref WL of the third zone Z3 may be an eighth word line WL8. An erase reference word line ERS_ref WL of each of the zones Z1 through Z3 may be a predetermined word line or a randomly selected word line. The nonvolatile memory device 100 detects the number of off cells of an erase reference word line ERS_ref WL for each of the zones Z1 through Z3. In an erase voltage control step Vers CTRL shown in FIGS. 12 through 16, the nonvolatile memory device 100 sequentially applies an off cell voltage Voc to the erase reference word lines ERS_ref WL of the zones Z1 through Z3 and detects the number of off cells associated with the erase reference word lines ERS_ref WL of each of the zones Z1 through Z3.

In exemplary embodiments, each of the zones Z1 through Z3 may include two or more erase reference word lines. In this case, the nonvolatile memory device 100 sequentially applies an off cell voltage Voc to each erase reference word lines ERS_ref WL of each zone and detects the number of off cells associated with each erase reference word lines of each zone.

In step S540, the nonvolatile memory device 100 adjusts a word line voltage of each zone, based on the number of off cells detected in each zone. For example, as described with reference to FIGS. 15 and 16, the nonvolatile memory device 100 controls a word line voltage based on the number of off cells detected. Similarly, the nonvolatile memory device 100 controls voltages of the first through third word lines WL1 through WL3 of the first zone Z1, based on the number of off cells in the first zone Z1. The nonvolatile memory device 100 controls voltages of the fourth through sixth word lines WL4 through WL6 of the second zone Z2, based on the number of off cells in the second zone Z2. The nonvolatile memory device 100 controls voltages of the seventh through ninth word lines WL7 through WL9 of the third zone Z3, based on the number of off cells in the third zone Z3.

Steps S552, S561, S562, and S570 are described with reference to FIG. 15, and a detailed description thereof is thus omitted.

Figure 19:
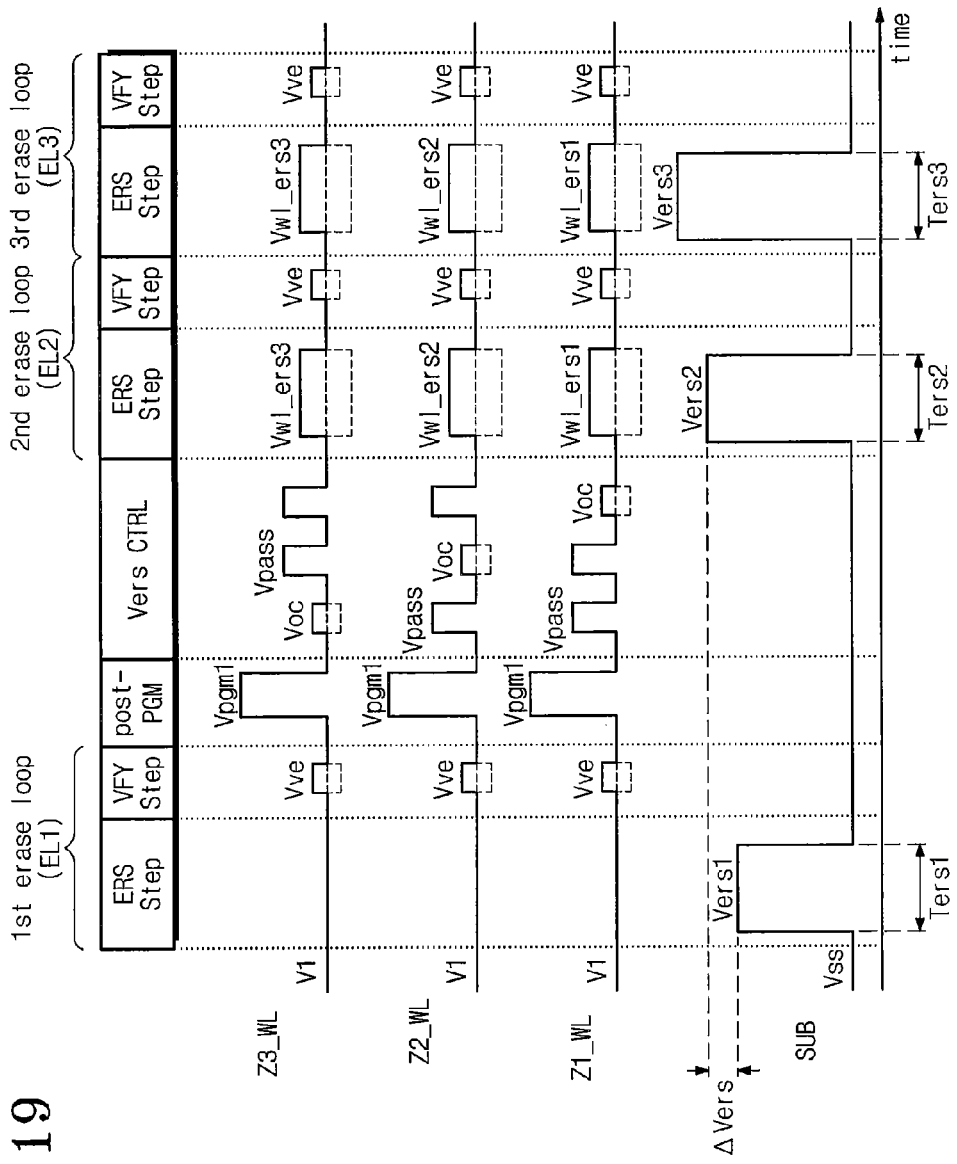
FIG. 19 is a timing diagram that illustrates operation of the nonvolatile memory device of FIG. 18.

FIG. 19 is a timing diagram illustrating operation of the method of the flow chart of FIG. 18. In FIG. 19, the horizontal axis represents time, and the vertical axis represents voltage. For the sake of easy description, voltages of the remaining lines (e.g., word lines and string and ground selection lines) other than erase reference word lines ERS_ref WL1, ERS_ref WL2, and ERS_ref WL3 of zones Z1 through Z3 are not illustrated in FIG. 19. However, the scope and spirit of the inventive concepts may not be limited thereto. Voltages of the word lines and the string and ground selection lines may be similar to those described with reference to FIGS. 1 through 16.

Referring to FIGS. 1 and 17 through 19, the nonvolatile memory device 100 performs a first erase loop EL1 and a post-program operation. Afterwards, in an erase voltage control step Vers CTRL, the nonvolatile memory device 100 detects off cells of the erase reference word lines ERS_ref WL1, ERS_ref WL2, and ERS_ref WL3 of the zones Z1 through Z3. For example, the nonvolatile memory device 100 sequentially applies an off cell voltage Voc to the erase reference word lines ERS_ref WL1, ERS_ref WL2, and ERS_ref WL3 of the zones Z1 through Z3 and detects the number of off cells in each zone.

In an erase step of a second erase loop EL2, the nonvolatile memory device 100 applies word line erase voltages Vwl_ers1, Vwl_ers2, and Vwl_ers3 to word lines of the zones Z1 through Z3. At this time, the nonvolatile memory device 100 applies a second erase voltage Vers2 to the substrate SUB. A level of the second erase voltage Vers2 is higher than that of a first erase voltage Vers1 by the predetermined erase voltage increment ΔVers.

In exemplary embodiments, each of the word line erase voltages Vwl_ers1, Vwl_ers2, and Vwl_ers3 may vary with the number of off cells of each zone. For example, when the number of off cells of the first zone Z1 is more than that of the second zone Z2, a level of the word line erase voltage Vwl_ers1 that is applied to the first zone Z1 is lower than that of the word line erase voltage Vwl_ers2 that is applied to the second zone Z2.

Afterwards, the nonvolatile memory device 100 performs a third erase loop EL3 in a manner similar to the second erase loop EL2.

As described above, the nonvolatile memory device 100 performs the first erase loop EL1 using a first erase scheme (e.g., post-programming) and then executes the remaining erase loops using a second erase scheme (e.g., controlling a word line voltage). The nonvolatile memory device 100 divides the memory block to be erased into a plurality of zones and separately controls word lines of the zones, thereby improving an erase distribution of the erased memory block. Thus, a nonvolatile memory device with improved reliability and an operating method thereof are provided.

Figure 20:
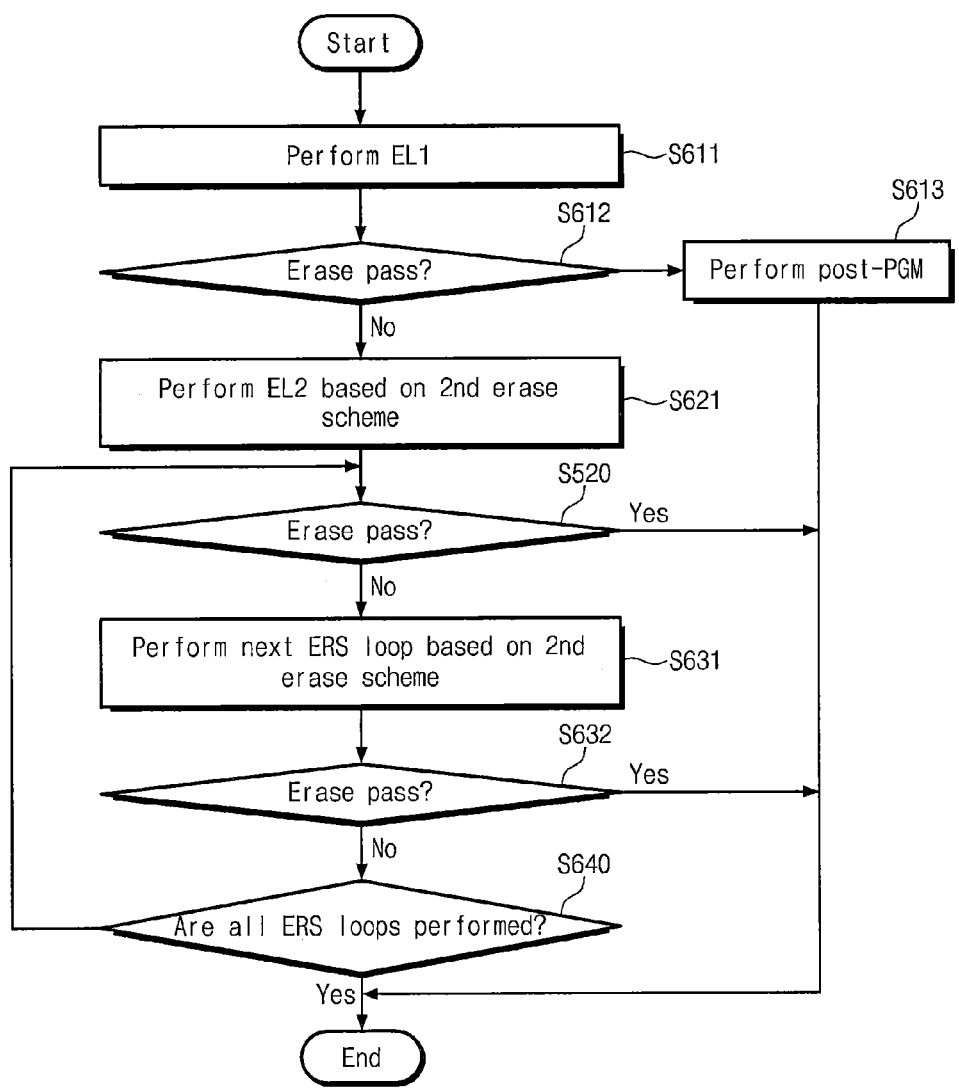
FIG. 20 is a flow chart illustrating operation of a nonvolatile memory device according to still another embodiment of the inventive concepts.

FIG. 20 is a flow chart showing operation of a nonvolatile memory device according to still another embodiment of the inventive concepts. Referring to FIGS. 1, 2, and 20, in step S611, the nonvolatile memory device 100 performs a first erase loop ELL In step S612, the nonvolatile memory device 100 determines whether the erasing of the first memory block BLK1 is passed.

If it is determined that the erasing of the first memory block BLK1 is passed, then operations proceed to step S613 and the nonvolatile memory device 100 performs a post-program operation.

If it is instead determined that the erasing of the first memory block BLK1 is not passed, operations proceed to step 621. In steps S621 through S640, the nonvolatile memory device 100 performs the remaining erase loops using the second erase scheme. Steps S621 through S640 are described with reference to FIGS. 3 through 19, and a detailed description thereof is thus omitted. For example, the second erase scheme may include the following: normal erase scheme, controlling of an erase voltage increment, and controlling of a word line voltage.

As described above, the nonvolatile memory device 100 performs a post-program operation or the remaining erase loops using a second erase scheme, based on whether a first erase loop EL1 is passed, thereby improving the erase distribution of the erased memory block. Thus, a nonvolatile memory device with improved reliability and an operating method thereof are provided.

Embodiments of the inventive concepts described above are exemplary, not limiting the spirit and scope of the inventive concepts. For example, an embodiment of the inventive concepts is exemplified as performing a first erase loop using a first erase scheme and performing the remaining erase loops are performed using a second erase scheme. However, the scope and spirit of the inventive concepts may not be limited thereto. For example, at least one of a plurality of erase loops may be performed using the first erase scheme, and the remaining erase loops may be performed using the second erase scheme.

Figure 21:
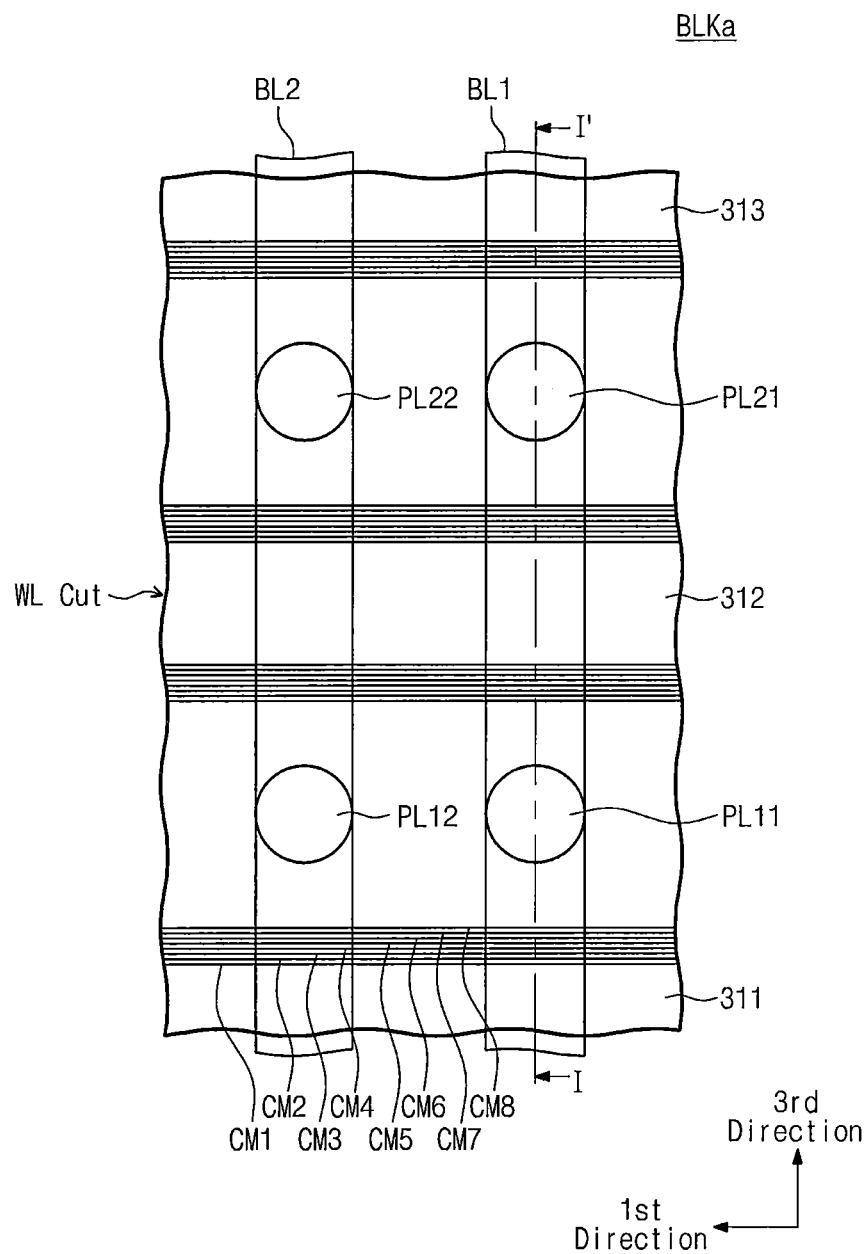
FIGS. 21 through 23 are diagrams showing a three-dimensional memory block according to still another embodiment of the inventive concepts.
Figure 22:
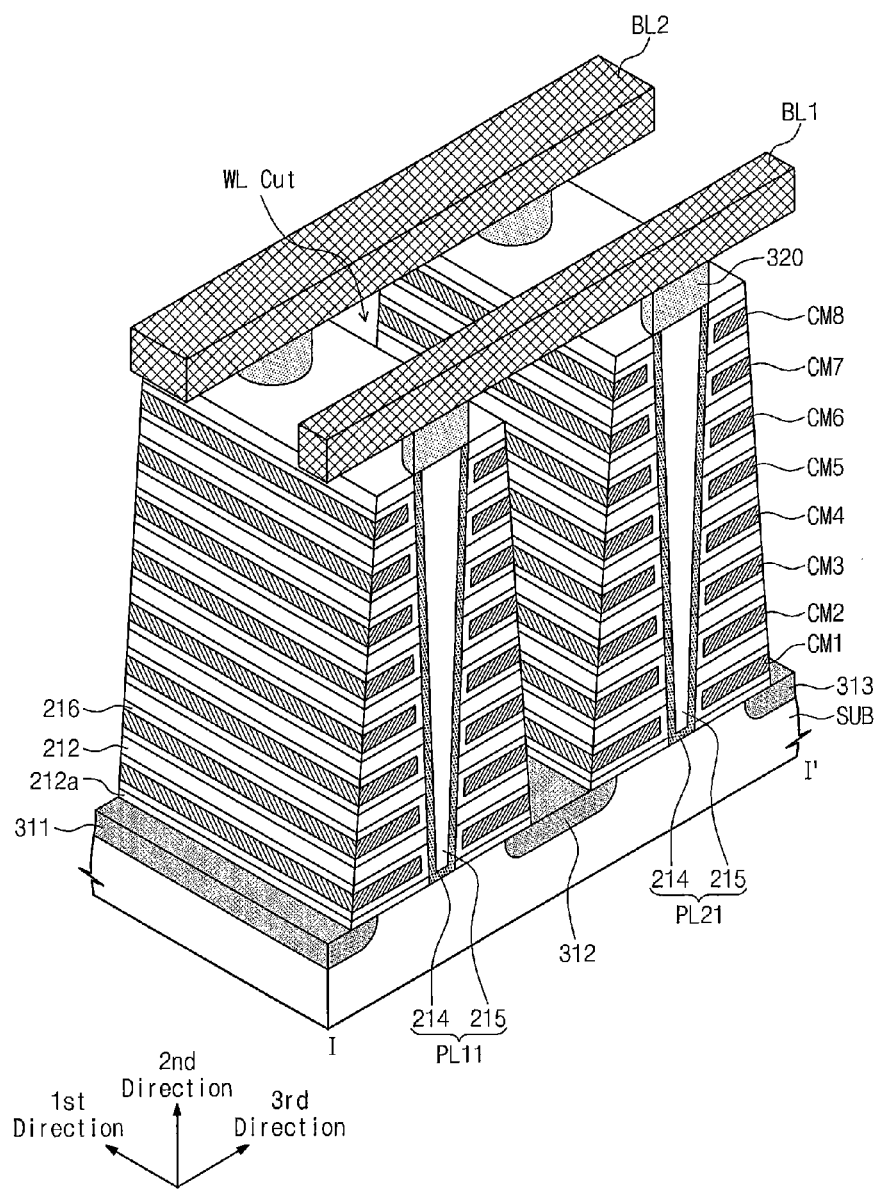
Figure 23:
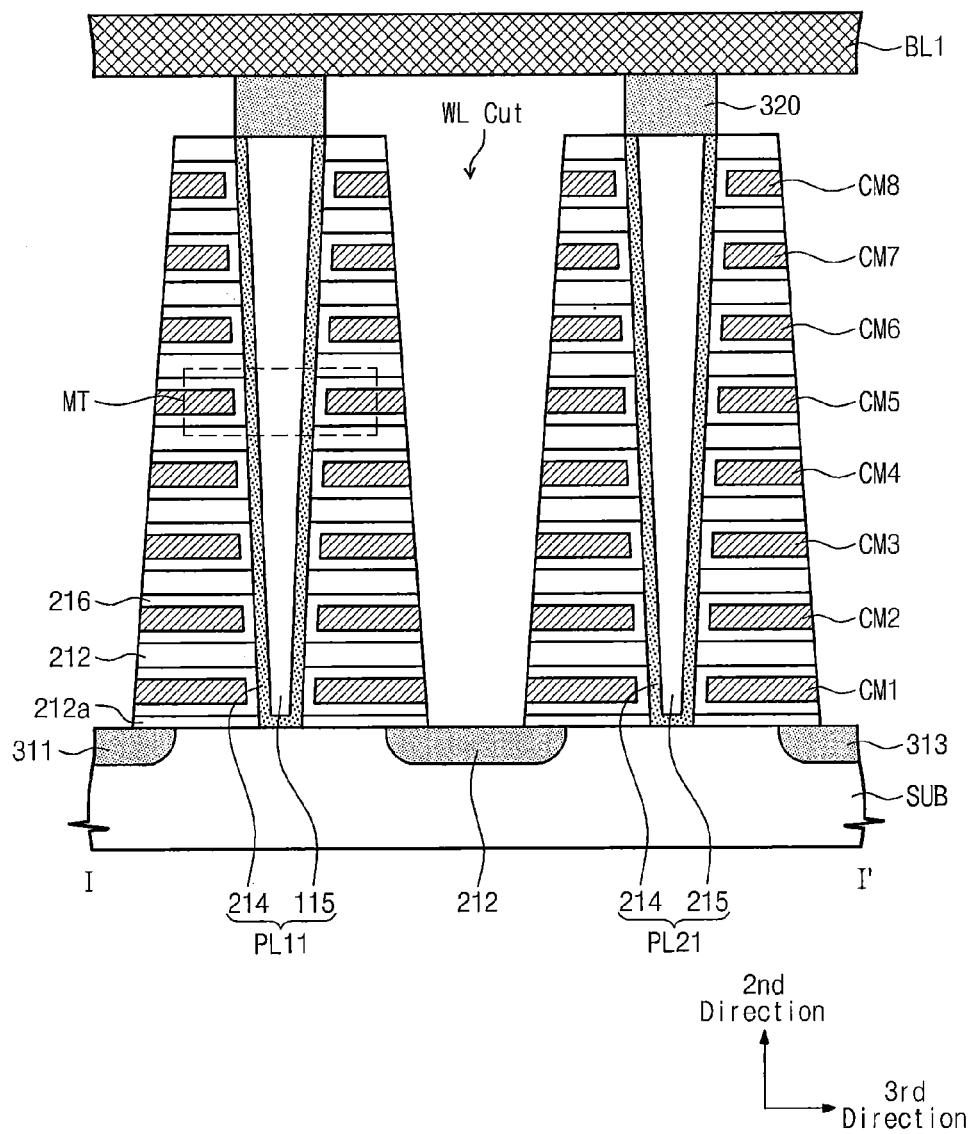

FIGS. 21 through 23 are diagrams showing a three-dimensional memory block according to still another embodiment of the inventive concepts. A plan view of conductive layers of a memory block BLKa is illustrated in FIG. 21. FIG. 22 is a perspective view taken along line I-I' in FIG. 21. FIG. 23 is a cross-sectional view taken along line I-I' in FIG. 21.

Referring to FIGS. 21 through 23, the memory block BLKa may include structures extending along first through third directions.

A substrate SUB may be provided. The substrate SUB may be a well having a first conductivity type. The substrate SUB may be a p-well in which the Group III element such as boron is injected, for example. The substrate SUB may be a pocket p-well which is provided within an n-well. Below, it is assumed that the substrate SUB is a p-well (or, a pocket p-well). However, the substrate SUB is not limited to p-type.

Doping regions 311 through 313 extending along the first direction are provided on the substrate SUB. The doping regions 311 through 313 are spaced apart from one another along the third direction. The doping regions 311 through 313 illustrated in FIGS. 21 through 23 are referred to as a first doping region 311, a second doping region 312, and a third doping region 313.

The first to third doping region 311 through 313 have a second conductivity type that is different from the first conductivity of the substrate SUB. For example, the first to third doping regions 311 through 313 may be n-type regions. Below, it is assumed that the first to third doping regions 311 through 313 are n-type regions. However, the first to third doping regions 311 through 313 are not limited to being n-type regions.

Between two adjacent ones of the first to third doping regions 311 through 313, a plurality of insulation materials 212 and 212a are provided sequentially on the substrate SUB along the second direction (i.e., a direction perpendicular to the substrate SUB). The insulation materials 212 and 212a are spaced apart along the second direction. The insulation materials 212 and 212a extend along the first direction. In exemplary embodiments, the insulation materials 212 and 212a include an insulation material such as a semiconductor oxide film. An insulation material 212a that contacts the substrate SUB may be thinner than the other insulation materials 212.

Between two adjacent ones of the first to third doping regions 311 through 313, a plurality of pillars PL11, PL12, PL21, and PL22 are arranged sequentially along the first direction so as to penetrate the plurality of insulation materials 212 and 212a along the second direction. In exemplary embodiments, the pillars PL11, PL12, PL21, and PL22 contact the substrate SUB through the insulation materials 212 and 212a.

In exemplary embodiments, the pillars PL11, PL12, PL21, and PL22 may have multi-layer structures. Each of the pillars PL11, PL12, PL21, and PL22 includes a channel film and an inner material within the channel film 114.

The channel films 214 may include a semiconductor material (e.g., silicon) having the first conductivity type. For example, the channel films 214 may include a semiconductor material (e.g., silicon) having the same conductivity type as the substrate SUB. Below, it is assumed that the channel films 214 include p-type silicon. However, the channel films 214 are not limited to including p-type silicon. The channel films 214 can include an intrinsic semiconductor material that is non-conductive.

The inner materials 215 may include an insulation material. For example, the inner materials 215 may include silicon oxide. Alternatively, the inner materials 215 may include air gaps.

Between two adjacent ones of the first to third doping regions 311 through 313, information storage films 216 are provided on exposed surfaces of the insulation materials 212 and 212a and the pillars PL11, PL12, PL21, and PL22. A thickness of the information storage films 216 may be less than a distance between the insulation films 212 and 212a.

Between two adjacent ones of the first to third doping regions 311 through 313, conductive materials CM1 through CM8 are provided on exposed surfaces of the information storage films 216. The conductive materials CM1 through CM8 extend along the first direction. In particular, the conductive materials CM1 through CM8 extending along the first direction are provided between an information storage film 216 provided at a lower surface of an upper-layer insulation material 212 and an information storage film 216 provided at an upper surface of a lower-layer insulation material 212.

The conductive materials CM1 through CM8 and the insulation materials 212 and 212a on the first to third doping regions 311 through 313 are separated by word line cuts. In exemplary embodiments, the conductive materials CM1 through CM8 may include a metallic conductive material. The conductive materials CM1 through CM8 may include a nonmetallic conductive material such as polysilicon.

A plurality of drains 320 are provided on the pillars PL11, PL12, PL21, and PL22, respectively. The drains 320 may include a semiconductor material (e.g., silicon) having the second conductivity type, for example. The drains 320 may include an n-type semiconductor material (e.g., silicon), for example. Below, it is assumed that the drains 320 include n-type silicon. However, the inventive concepts are not limited thereto. The drains 320 can extend to the top surfaces of the channel films 214 of the pillars PL11, PL12, PL21, and PL22.

Bit lines BL extending in the third direction are provided on the drains 320 so as to be spaced apart from one another along the first direction. The bit lines BL are coupled with the drains 320. In exemplary embodiments, the drains 320 and the bit lines BL may be connected via contact plugs (not shown). The bit lines BL may include a metallic conductive material. Alternatively, the bit lines BL may include a nonmetallic conductive material such as polysilicon.

Below, rows and columns of the pillars PL11, PL12, PL21, and PL22 of the memory block BLKa may be defined. In exemplary embodiments, rows of the pillars PL11, PL12, PL21, and PL22 may be defined according to whether the conductive materials CM1 through CM8 are separated. In FIGS. 21 through 23, the conductive materials CM1 through CM8 may be separated with the second doping region 312 as the center.

The pillars PL11 and PL12 coupled with the conductive materials CM1 through CM8, provided between the first and second doping regions 311 and 312, via the information storage films 216 may be defined as the first row of pillars. The pillars PL21 and PL22 coupled with the conductive materials CM1 through CM8, provided between the second and third doping regions 312 and 313, via the information storage films 216 may be defined as the second row of pillars.

Columns of the pillars PL11, PL12, PL21, and PL22 may be defined according to the bit lines BL1 and BL2. The pillars PL11 and PL21 connected with the first bit line BL1 via the drains 320 may be defined as the first column. The pillars PL12 and PL22 connected with the second bit line BL1 via the drains 320 may be defined as the second column.

The conductive materials CM1 through CM8 may have the first height to the eighth height according to a distance from the substrate SUB. The first conductive material CM1 that is closest to the substrate SUB may have the first height, and the eighth conductive material CM8 that is closest to a bit line may have the eighth height.

The plurality of pillars PL11, PL12, PL21, and PL22 may form a plurality of cell strings together with the information storage films 216 and the plurality of conductive materials CM1 through CM8. That is, each of the pillars PL11, PL12, PL21, and PL22 may form a cell string with an information storage film 216 and an adjacent conductive material.

Each cell string may include a plurality of cell transistors MT stacked in a direction perpendicular to the substrate SUB. The cell transistors MT will be more fully described with reference to FIG. 24. For example, each cell transistor MT may be a Charge Trap Flash (CTF) memory cell.

Figure 24:
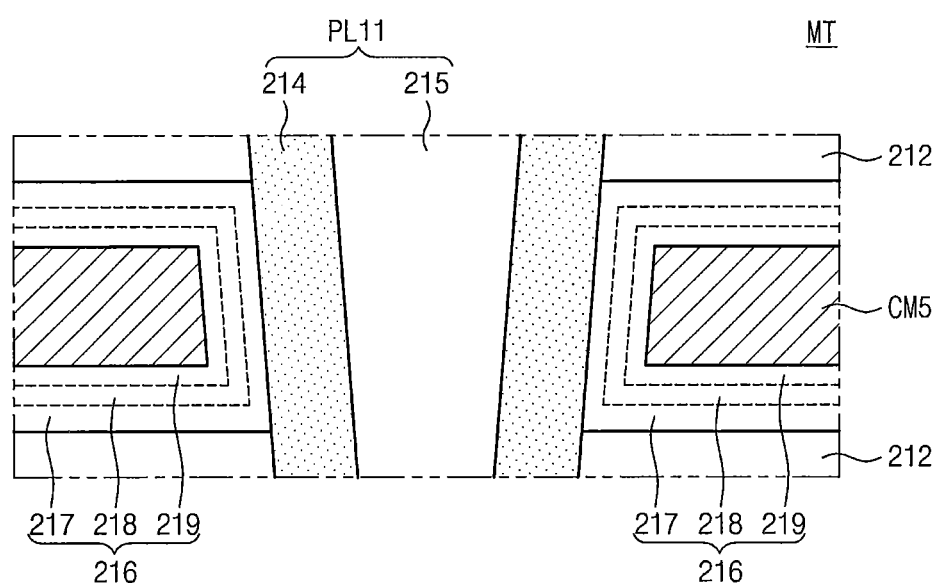
FIG. 24 is a diagram illustrating one of cell transistors in FIG. 23.

FIG. 24 is a diagram illustrating one of cell transistors in FIG. 23. In FIG. 24, there is exemplarily shown a cell transistor having a fifth height corresponding to a pillar PL11 at the first row and first column.

Referring to FIGS. 21 through 24, cell transistors MT are formed of the fifth conductive material CM5, a portion of a pillar PL11 adjacent to the fifth conductive material CM5, and information storage films 216 provided between the fifth conductive material CM5 and the pillar PL11.

The information storage films 216 may extend to upper surfaces and lower surfaces of the conductive materials CM1 through CM8 from regions between the conductive materials CM1 through CM8 and the pillars PL11, PL12, PL21, and PL22. Each of the information storage films 216 may include the first to third 214 insulation films 217, 218, and 219.

In the cell transistors MT, the channel films 214 of the pillars PL11, PL12, PL21, and PL22 may include the same p-type silicon as the substrate SUB. The channel films 214 may act as bodies of cell transistors MT. The channel films 214 may be formed in a direction that is generally perpendicular to the substrate SUB. The channel films 214 of the pillars PL11, PL12, PL21, and PL22 may act as a vertical body. Vertical channels may be formed at the channel films 214.

The first sub insulation films 217 adjacent to the pillars PL11, PL12, PL21, and PL22 may act as tunneling insulation films of the cell transistors MT. For example, each of the first sub insulation films 217 adjacent to the pillars PL11, PL12, PL21, and PL22 may include a thermal oxide film such as, for example, a silicon oxide film.

The second sub insulation films 218 may act as charge storage films of the cell transistors MT. For example, the second sub insulation films 218 may act as charge trap films. For example, the second sub insulation films 218 may include a nitride film or a metal oxide film (e.g., an aluminum oxide film, a hafnium oxide film, etc.), respectively. The second sub insulation films 218 may include a silicon nitride film.

The third sub insulation films 219 adjacent to the conductive materials CM1 through CM8 may act as blocking insulation films of the cell transistors CT. In an exemplary embodiment, the third sub insulation films 219 may be formed of a single layer or multiple layers. The third sub insulation films 219 may be a high dielectric film (e.g., an aluminum oxide film, a hafnium oxide film, etc.) having a dielectric constant larger than those of the first and second sub insulation films 217 and 218. The third sub insulation films 219 may include a silicon oxide film, respectively.

In exemplary embodiments, the first to third sub insulation films 217 to 219 may constitute ONO (oxide-nitride-oxide).

The plurality of conductive materials CM1 through CM8 may act as gates (or, control gates).

That is, the plurality of conductive materials CM1 through CM8 acting as gates (or, control gates), the third sub insulation films 219 acting as block insulation films, the second sub insulation films 218 acting as charge storage films, the first sub insulation films 217 acting as tunneling insulation films, and the channel films 214 acting as vertical bodies may operate as cell transistors MT stacked in a direction perpendicular to the substrate SUB. Exemplarily, the cell transistors MT may be a charge trap type cell transistor.

The cell transistors MT can be used for different purposes according to height. For example, among the cell transistors MT, at least one cell transistor placed at an upper portion may be used as a string selection transistor. Among the cell transistors MT, at least one cell transistor placed at a lower portion may be used as a ground selection transistor. Remaining cell transistors between cell transistors used as string and ground selection transistors may be used as memory cells and dummy memory cells.

The conductive materials CM1 through CM8 may extend along a row direction (or, the first direction) to connect to the plurality of pillars PL11 and PL12 or PL21 and PL22. The conductive materials CM1 through CM8 may constitute conductive lines interconnecting cell transistors MT of the same row of pillars PL11 and PL12 or PL21 and PL22.

In exemplary embodiments, the conductive materials CM1 through CM8 may be used as a string selection line SSL, a ground selection line GSL, a word line WL, and a dummy word line DWL according to their heights above the substrate SUB.

Figure 25:
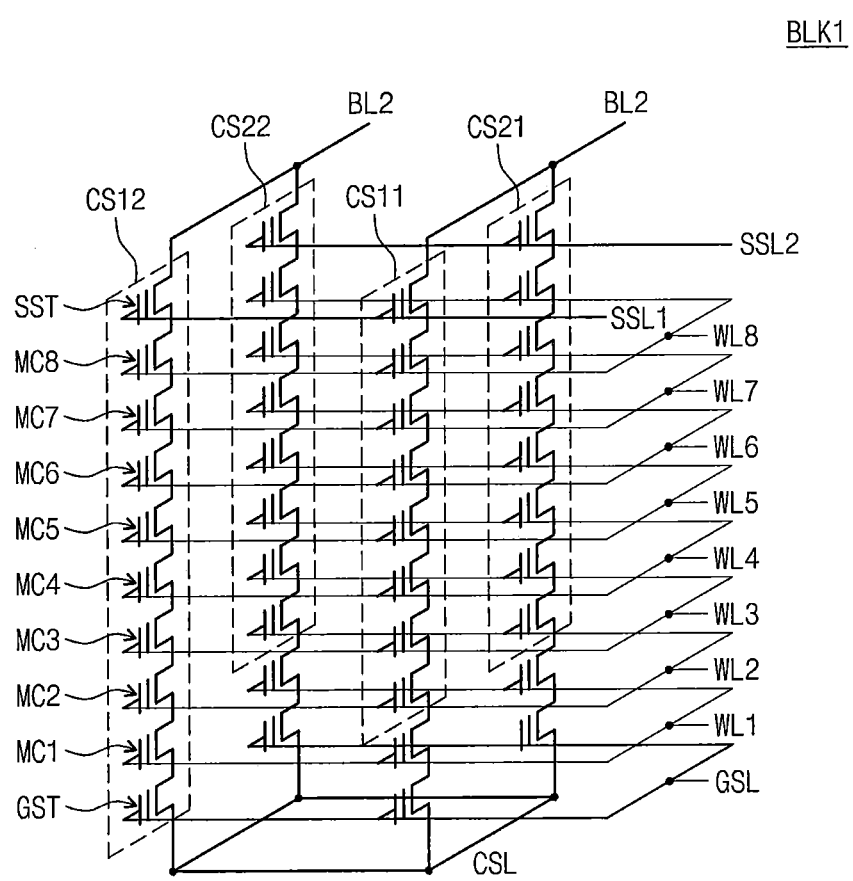
FIG. 25 is an equivalent circuit diagram of the three-dimensional memory block described with reference to FIGS. 21 through 24.

FIG. 25 is an equivalent circuit diagram of a three-dimensional memory block described with reference to FIGS. 21 through 24.

Referring to FIG. 25, a memory block BLKa includes a plurality of cell strings CS11, CS12, CS21, and CS22. The cell strings CS11, CS12, CS21, and CS22 are arranged along a row direction and a column direction to form rows and columns.

Each of the cell strings CS11, CS12, CS21, and CS22 includes a plurality of cell transistors. In each cell string, the cell transistors include a string selection transistor SST, memory cells MC1 through MC8, and a ground selection transistor GST. In the cell strings CS11, CS12, CS21, and CS22, the string selection transistors SST are connected to a string selection line SSL. The string selection line SSL is divided into first and second string selection lines SSL1 and SSL2. In the cell strings CS11, CS12, CS21, and CS22, the memory cells MC1 through MC8 are connected to word lines WL1 through WL8. Word lines at the same height are interconnected. In the cell strings CS11, CS12, CS21, and CS22, the ground selection transistors GST are connected to a ground selection line GSL. Each cell string is connected between a bit line BL and a common source line CSL. That is, in each of the cell strings CS11, CS12, CS21, and CS22, the string selection transistor SST is connected to a bit line, and the ground selection transistor GST is connected to the common source line CSL.

Cell strings that are disposed in the same column are connected to the same bit line. For example, the cell strings CS11 and CS21 are connected to a first bit line BL1, and the cell strings CS12 and CS22 are connected to a second bit line BL2.

Cell strings that are disposed in the same row are connected to the same string selection line. For example, cell strings CS11 and CS12 are connected to the first string selection line SSL1, and cell strings CS21 and CS22 are connected to the second string selection line SSL2.

In exemplary embodiments, each of the cell strings CS11, CS12, CS21, and CS22 may be stacked in a direction perpendicular to a substrate (not shown). For example, the ground selection transistor GST, the memory cells MC1 through MC8, and the string selection transistor SST are stacked in a direction perpendicular to the substrate. For example, each memory cell may be a CTF memory cell.

The memory block BLKa shown in FIGS. 21 through 25 is exemplary, not limiting the spirit and scope of the inventive concepts. For example, the number of rows of cell strings may increase or decrease. As the number of rows of cell strings is changed, the number of string selection lines or ground selection lines connected with rows of cell strings and the number of cell strings connected to a bit line also changes.

The number of columns of cell strings may increase or decrease. As the number of columns of cell strings is changed, the number of bit lines connected with columns of cell strings and the number of cell strings connected to a string selection line also changes.

A height of a cell string may increase or decrease. For example, the number of memory cells included in each cell string may increase or decrease. As the number of memory cells included in each cell string is changed, the number of word lines also changes. For example, the number of string selection transistors or ground selection transistors that each cell string includes may increase. As the number of string selection transistors or ground selection transistors that each cell string includes is changed, the number of string selection lines or ground selection lines also changes. When the number of string selection lines or ground selection lines increases, string selection transistors or ground selection transistors may be stacked in the same manner as memory cells MC1 through MC8.

In exemplary embodiments, writing and reading may be performed by a unit of a row of cell strings CS11, CS21, CS12, and CS22. The cell strings CS11, CS21, CS12, and CS22 are selected by the row by activating the string selection lines SSL1 and SSL2 selectively.

Writing and reading about a selected row of cell strings CS11, CS21, CS12, and CS22 is performed by the page. A page may be a row of memory cells connected with a word line. In a selected row of cell strings CS11, CS21, CS12, and CS22, memory cells may be selected by the page by activating word lines WL1 through WL8 selectively. In exemplary embodiments, erasing may be made by the memory block.

An operating method of the nonvolatile memory device described with reference to FIGS. 1 through 20 is applied to a memory block BLKa described with reference to FIGS. 21 through 25. For example, a nonvolatile memory device 100 performs a plurality of erase loops to erase the memory block BLKa. The nonvolatile memory device 100 performs a first erase loop using a first erase scheme (e.g., post-programming) and then executes the remaining erase loops using a second erase scheme (e.g., normal erase scheme, adjusting an erase voltage increment, and controlling a word line voltage).

Figure 26:
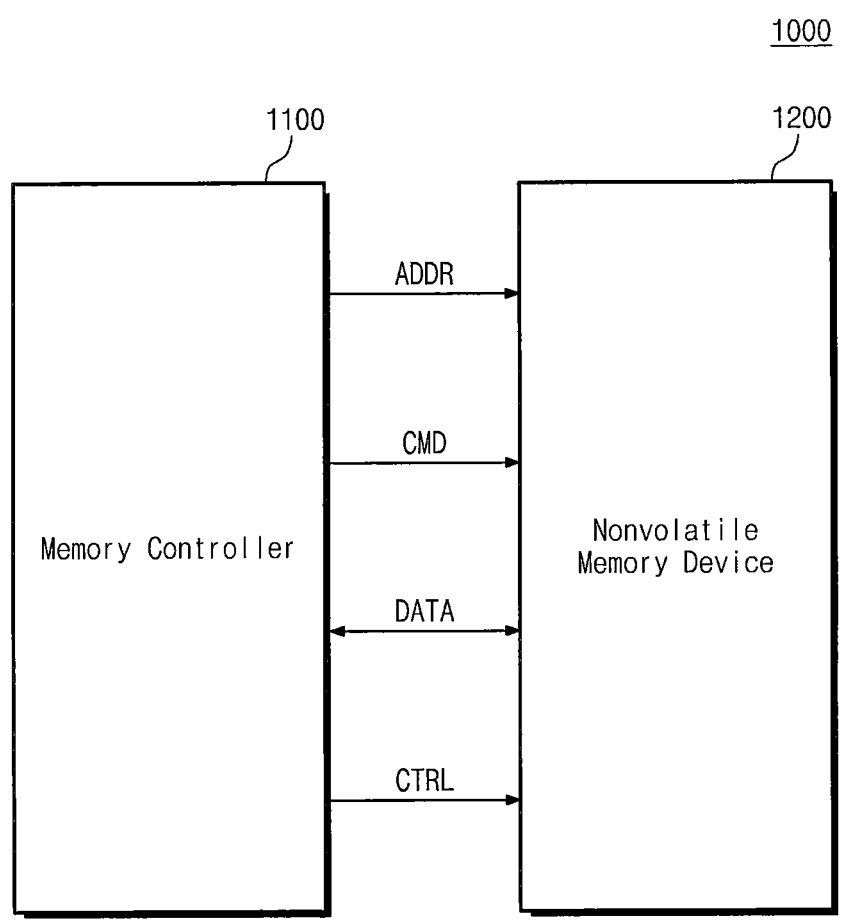
FIG. 26 is a block diagram schematically illustrating a nonvolatile memory system to which a nonvolatile memory device according to embodiments of the inventive concepts may be applied.

FIG. 26 is a block diagram schematically illustrating a nonvolatile memory system to which a nonvolatile memory devices according to embodiments of the inventive concepts may be applied. Referring to FIG. 26, a nonvolatile memory system 1000 contains a memory controller 1100 and a nonvolatile memory device 1200.

The memory controller 1100 controls the nonvolatile memory device 1200 in response to a request of an external device (e.g., host or application processor). For example, the memory controller 110 sends an address ADDR, a command CMD, and a control signal CTRL to the nonvolatile memory device 1200 to read data stored at the nonvolatile memory device 1200. The nonvolatile memory device 1200 transmits data to the memory controller 1100 in response to signals from the memory controller 1100.

The memory controller 110 sends an address ADDR, a command CMD, a control signal CTRL, and data to the nonvolatile memory device 1200 to store the data in the nonvolatile memory device 1200. The nonvolatile memory device 1200 stores data in response to signals from the memory controller 1100.

The nonvolatile memory device 1200 may be a nonvolatile memory device described with reference to FIGS. 1 through 25. That is, during an erase operation, the nonvolatile memory device 1200 performs at least one of erase loops using a first erase scheme and then executes the remaining erase loops using a second erase scheme.

Figure 27:
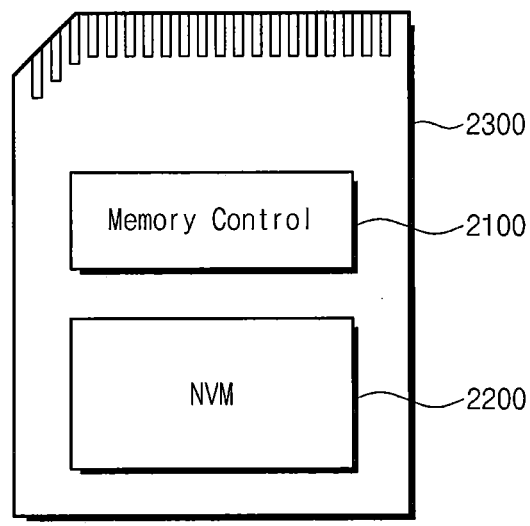
FIG. 27 is a block diagram schematically illustrating a memory card system including a nonvolatile memory system according to embodiments of the inventive concepts.

FIG. 27 is a block diagram schematically illustrating a memory card system including a nonvolatile memory system according to embodiments of the inventive concepts.

Referring to FIG. 27, a memory card system 2000 contains a memory controller 2100, a nonvolatile memory 2200, and a connector 2300.

The memory controller 2100 is connected to the nonvolatile memory 2200. The memory controller 2100 is configured to access the nonvolatile memory 2200. For example, the memory controller 2100 may be adapted to control an overall operation of the nonvolatile memory 2200 including, but not limited to, a read operation, a write operation, an erase operation, and a background operation. The memory controller 2100 provides an interface between the nonvolatile memory 2200 and a host. The memory controller 2100 is configured to drive firmware for controlling the nonvolatile memory 2200.

In exemplary embodiments, the memory controller 2100 may include components such as, but not limited to, a RAM, a processing unit, a host interface, a memory interface, and an error correction unit.

The memory controller 2100 communicates with an external device through the connector 220. The memory controller 2100 communicates with an external device according to a particular communication protocol. For example, the memory controller 2100 may communicate with the external device through at least one of various interface protocols such as, but not limited to, universal serial bus (USB, multimedia card (MMC), eMMC (embedded MMC), peripheral component interconnection (PCI), PCI-express (PCI-E), advanced technology attachment (ATA), a serial-ATA protocol, parallel-ATA, small computer small interface (SCSI), enhanced small disk interface (ESDI), integrated drive electronics (IDE), UFS (Universal Flash Storage), WiFi, Bluetooth, NVMe, and Firewire. In exemplary embodiments, the connector 2300 may be defined by at least one of the communication protocols.

In exemplary embodiments, the nonvolatile memory 2200 may be implemented with a variety of nonvolatile memory devices, such as, but not limited to, an EPROM (Electrically Erasable and Programmable ROM), a NAND flash memory, a NOR flash memory, a PRAM (Phase-change RAM), an ReRAM (Resistive RAM), a FRAM (Ferroelectric RAM), and an STT-MRAM (Spin-Torque Magnetic RAM).

The memory controller 2100 or the nonvolatile memory 2200 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP). Alternatively, the nonvolatile memory 2200 may include a plurality of nonvolatile memory chips, which are implemented in one of the above-described packaging technologies.

In exemplary embodiments, the memory controller 2100 and the nonvolatile memory 2200 may be integrated in a single semiconductor device. The memory controller 2100 and the nonvolatile memory 2200 may be integrated in a single semiconductor device to form a solid state drive (SSD). The memory controller 2100 and the nonvolatile memory 2200 may be integrated in a single semiconductor device to form a memory card such as, but not limited to, a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The nonvolatile memory device 2200 may be a nonvolatile memory device described with reference to FIGS. 1 through 25. The nonvolatile memory device 2200 may erase memory blocks using an erase operation described with reference to FIGS. 1 through 25.

Figure 28:
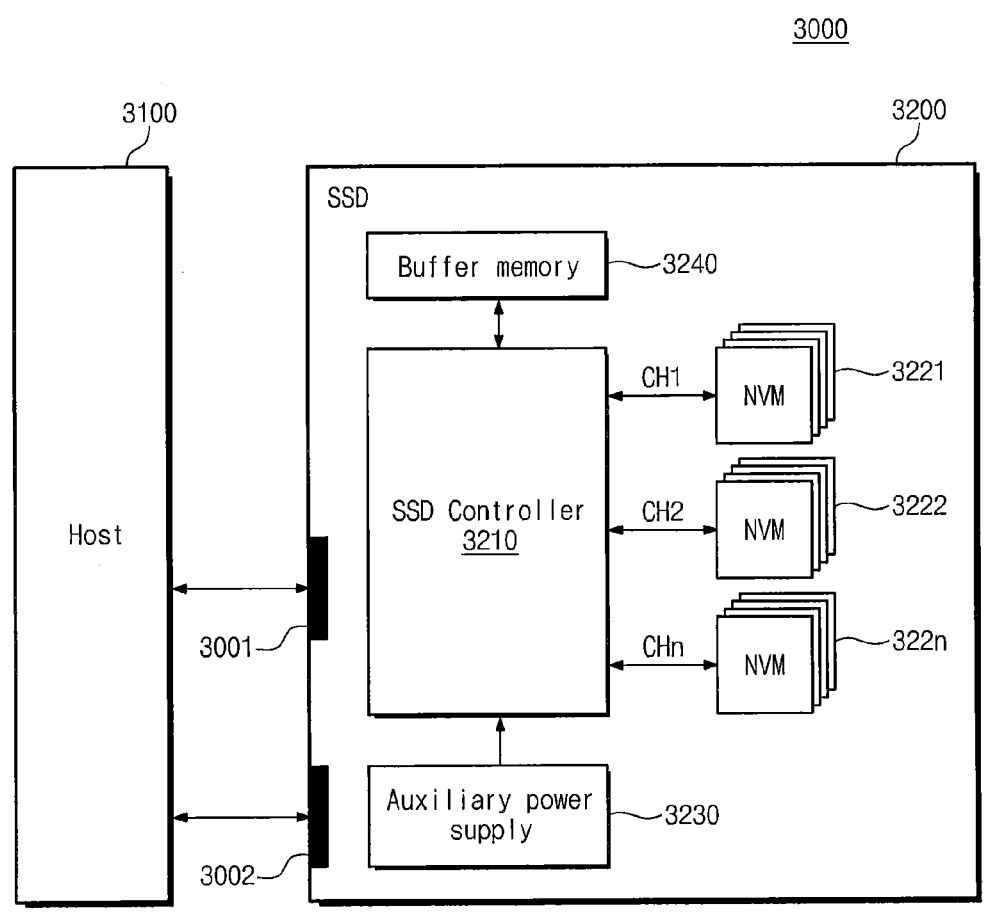
FIG. 28 is a block diagram illustrating a solid state drive including a nonvolatile memory system according to an embodiment of the inventive concepts.

FIG. 28 is a block diagram illustrating a solid state drive including a nonvolatile memory system according to an embodiment of the inventive concepts. Referring to FIG. 28, a solid state drive (SSD) system 3000 comprises a host 3100 and an SSD 3200. The SSD 3200 exchanges signals SGL with the host 3100 through the host interface 3001 and is supplied with a power through a power connector 3002. The SSD 3200 comprises a plurality of flash memories 3221 to 322n, an SSD controller 3210, an auxiliary power supply 3230, and a buffer memory 3240.

The SSD controller 3210 controls the flash memories 3221 to 322n in response to a signal SIG from the host 3100. For example, the signal SIG may be a signal that is based on interfaces of the host 3100 and the SSD 3200. For example, the signal SIG may be a signal defined in compliance with at least one of various interface protocols such as, but not limited to, universal serial bus (USB, multimedia card (MMC), eMMC (embedded MMC), peripheral component interconnection (PCI), PCI-express (PCI-E), advanced technology attachment (ATA), a serial-ATA protocol, parallel-ATA, small computer small interface (SCSI), enhanced small disk interface (ESDI), integrated drive electronics (IDE), UFS (Universal Flash Storage), WiFi, Bluetooth, NVMe, and Firewire.

The auxiliary power supply 3230 is connected to the host 3100 via the power connector 3002. The auxiliary power supply 3230 is charged by a power PWR from the host 3100. When a power is not smoothly supplied from the host 3100, the auxiliary power supply 3230 powers the SSD system 3000. The auxiliary power supply 3230 may be placed inside or outside the SSD 3200. For example, the auxiliary power supply 3230 may be put on a main board to supply an auxiliary power to the SSD 3200.

The buffer memory 3240 acts as a buffer memory of the SSD 3200. For example, the buffer memory 3240 temporarily stores data received from the host 3100 or from the flash memories 3221 to 322n, or it temporarily stores metadata (e.g., mapping tables) of the flash memories 3221 to 322n. The buffer memory 3240 may include volatile memories such as DRAM, SDRAM, DDR SDRAM, LPDDR SDRAM, SRAM, and so on or nonvolatile memories such as FRAM ReRAM, STT-MRAM, PRAM, and so on.

The nonvolatile memories 3221 through 322n may be implemented with a nonvolatile memory device described with reference to FIGS. 1 through 25. The nonvolatile memories 3221 through 322n may erase memory blocks based on an erase method described with reference to FIGS. 1 through 25.

Figure 29:
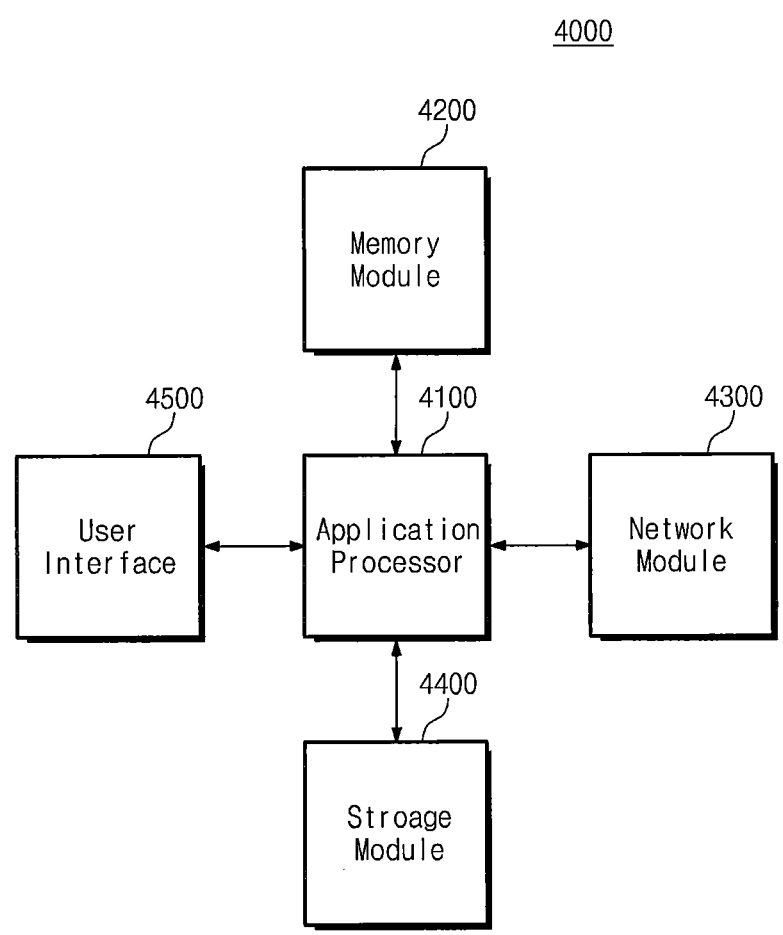
FIG. 29 is a block diagram schematically illustrating a system including a nonvolatile memory system according to an embodiment of the inventive concepts.

FIG. 29 is a block diagram schematically illustrating a user system including a nonvolatile memory system according to an embodiment of the inventive concepts. Referring to FIG. 29, a user system 4000 includes an application processor 4100, a memory module 4200, a network module 4300, a storage module 4400, and a user interface 4500.

The application processor 4100 drives components of the user system 4000, an operating system, and so on. For example, the application processor 4100 may include controllers for controlling components of the user system 4000, graphics engines, a variety of interfaces, and so on. The application processor 4100 may be implemented with a system-on-chip (SoC).

The memory module 4200 operates as a main memory, a working memory, a buffer memory, or a cache memory of the user system 4000. The memory module 4200 may be implemented with a volatile random access memory, such as DRAM (Dynamic Random Access Memory), SDRAM (Synchronous DRAM), DDR SDRAM (Double Date Rate SDRAM), DDR2 SDRAM, DDR3 SDRAM, LPDDR DRAM, LPDDR2 DRAM, or LPDDR3 DRAM or a nonvolatile random access memory, such as PRAM (Phase-change RAM), MRAM (Magnetic RAM), RRAM (Resistive RAM), or FRAM (Ferroelectric RAM). In exemplary embodiments, the application processor 4100 and the memory module 4200 are packed in a semiconductor package depending on the POP (Package on Package).

The network module 4300 communicates with external devices. For example, the network module 4300 may support wireless communications, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, WI-DI, and so on. As another embodiment, the network module 4300 may be embedded in the application processor 4100.

The storage module 4400 stores data. For example, the storage module 4400 stores data received from the application processor 4100. Alternatively, the storage module 4400 provides the application processor 4100 with data stored therein. For example, the storage module 4400 may be implemented with a nonvolatile semiconductor memory device such as PRAM, MRAM, RRAM, NAND flash memory, NOR flash memory, or a three-dimensional NAND flash memory. In exemplary embodiments, the storage module 4400 may be implemented with a removable drive, such as a memory card of the user system 4000 or an external drive.

The storage module 4400 may include a plurality of nonvolatile memory devices, each of which is a nonvolatile memory device described with reference to FIGS. 1 through 25. That is, each nonvolatile memory device included in the storage module 4400 erases memory blocks based on an erase method described with reference to FIGS. 1 through 25.

The user interface 4500 may provide interfaces for providing data or commands to the application processor 4100 or for outputting data to an external device. For example, the input interface 4500 may include user input interfaces, such as a key board, a key pad, a button, a touch panel, a touch screen, a touch pad, a touch ball, a camera, a microphone, a Gyroscope, a vibration sensor, and a piezoelectric element. The input interface 4500 may include user output interfaces, such as an LCD (Liquid Crystal Display) device, an OLED (Organic Light Emitting Diode) display device, an AMO-LED (Active Matrix OLED) display device, an LED, a speaker, and a motor.

In the embodiments of the inventive concepts described above, a nonvolatile memory device performs a plurality of erase loops to erase a memory block. The nonvolatile memory device performs at least one erase loop using a first erase scheme and then executes the remaining erase loops using a second erase scheme. The first and second erase schemes may include the following erase schemes: pre-program, post-program, adjusting of an erase voltage increment, and adjusting of a word line voltage. Two different erase schemes are used during an erase operation where a plurality of erase loops are executed, thereby improving the erase distribution of the erased memory block. Thus, a nonvolatile memory device and an operating method thereof may be improved.

While the inventive concepts have been described with reference to exemplary embodiments, it will be apparent to those skilled in the art that various changes and modifications may be made without departing from the spirit and scope of the inventive concepts. Therefore, it should be understood that the above embodiments are not limiting, but illustrative.

What is claimed is:

1. A method of operating a nonvolatile memory device which sequentially performs a plurality of erase loops to erase a memory block, the method comprising:
   performing at least one of the erase loops;
   performing a post-program operation on the memory block after the at least one erase loop is performed; and
   performing the remaining erase loops by:
      detecting a threshold voltage distribution of the memory block;
      adjusting an erase voltage increment based on the detected threshold voltage distribution; and
      performing at least one of the remaining erase loops using the adjusted erase voltage increment,
   wherein the post-program operation is not performed when each of the remaining erase loops is performed, and
   wherein detecting the threshold voltage distribution comprises detecting off cells that have a threshold voltage that is higher than an off cell voltage from among memory cells that are connected to an erase reference word line, wherein the erase reference word line is one of a plurality of word lines that are connected to the memory block.

2. The method of claim 1, wherein adjusting the erase voltage increment comprises adjusting the erase voltage increment based on the number of off cells that are detected.

3. The method of claim 1, wherein adjusting the erase voltage increment comprises adjusting a pulse width of an erase voltage based on the number of off cells that are detected.

4. A method of erasing a memory block of a nonvolatile memory device, the method comprising:
   performing a first erase loop using a first erase scheme; and then
   detecting a threshold voltage distribution of the memory block;
   adjusting an erase voltage increment based on the detected threshold voltage distribution to provide an adjusted erase voltage increment; and
   performing a second erase loop using a second erase scheme that is different from the first erase scheme, wherein the adjusted erase voltage increment is used in performing the second erase loop,
   wherein the memory block includes a plurality of memory cells and a plurality of word lines are connected to the memory block, and
   wherein detecting the threshold voltage distribution of the memory block comprises:
      selecting a subset of the plurality of memory cells; and
      detecting a number of the memory cells in the subset of the plurality of memory cells that have a threshold voltage that is higher than an off cell voltage.

5. The method of claim 4, wherein the adjusted erase voltage increment is used to set voltages that are applied to a plurality of word lines that are connected to the memory block during the second erase loop.

6. The method of claim 4, wherein adjusting the erase voltage increment based on the detected threshold voltage distribution to provide an adjusted erase voltage increment comprises adjusting the erase voltage increment based on the detected number of memory cells that have a threshold voltage that is higher than an off cell voltage.

7. The method of claim 4, wherein the first erase scheme includes a post-program operation in which a plurality of program loops are performed, wherein each program loop includes a program step in which a program voltage is applied to a word line to program memory cells that are connected to the word line and a verification step where a program verification voltage is applied to verify program states of the memory cells, and wherein the second erase scheme does not include the post-program operation.

* * * * *